(12) United States Patent
Suzuki et al.

(10) Patent No.: US 7,965,510 B2
(45) Date of Patent: Jun. 21, 2011

(54) POWER CONVERSION APPARATUS AND POWER MODULE

(75) Inventors: Hideyo Suzuki, Hitachinaka (JP);
Keisuke Horiuchi, Hitachinaka (JP);
Fusanori Nishikimi, Hitachinaka (JP);
Atsushi Yukita, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 73 days.

(21) Appl. No.: 12/473,956

(22) Filed: May 28, 2009

(65) Prior Publication Data

US 2010/0097765 A1    Apr. 22, 2010

(30) Foreign Application Priority Data

Jul. 29, 2008   (JP) ................................. 2008-195340

(51) Int. Cl.
*H05K 7/20* (2006.01)
(52) U.S. Cl. ................... 361/699; 361/679.53; 361/698; 361/689; 363/65; 363/141; 363/143; 307/43; 307/9.1; 307/10.1; 165/80.4; 165/80.5; 62/259.2
(58) Field of Classification Search .......... 361/605–642, 361/679.46, 679.53, 688, 689, 699, 704–712, 361/715, 718, 719–724, 734, 760, 763, 766, 361/775, 782, 793, 794, 818, 831; 363/141, 363/142, 143, 137, 144–147, 56.02; 307/9.1, 307/10.1, 11, 38, 115; 62/228.1, 259.2; 29/592.1, 29/740, 741, 759, 602.1, 831, 832; 257/706–727, 257/678; 165/80.3, 80.4, 80.5, 104.33, 104.34, 165/185
See application file for complete search history.

(56) References Cited

U.S. PATENT DOCUMENTS

| | | | | |
|---|---|---|---|---|
| 5,504,378 A * | 4/1996 | Lindberg et al. | ............. | 307/10.1 |
| 5,966,291 A * | 10/1999 | Baumel et al. | ................. | 361/707 |
| 6,078,155 A | 6/2000 | Tominaga et al. | | |
| 6,166,937 A * | 12/2000 | Yamamura et al. | ........... | 363/141 |
| 6,414,867 B2 * | 7/2002 | Suzuki et al. | ................. | 363/141 |
| 6,483,185 B1 | 11/2002 | Nagase et al. | | |
| 6,501,662 B2 * | 12/2002 | Ikeda | ........................... | 361/760 |
| 6,614,867 B1 * | 9/2003 | Kronenberg et al. | ......... | 376/147 |
| 6,621,701 B2 * | 9/2003 | Tamba et al. | ................. | 361/699 |
| 6,762,937 B2 * | 7/2004 | Kimoto et al. | ................. | 361/699 |
| 6,906,404 B2 * | 6/2005 | Maly et al. | ..................... | 257/678 |
| 6,987,670 B2 * | 1/2006 | Ahmed et al. | ................. | 361/699 |
| 7,090,044 B2 * | 8/2006 | Nakamura et al. | ........... | 180/65.8 |

(Continued)

FOREIGN PATENT DOCUMENTS

EP     0 844 812 A1     5/1998
(Continued)

OTHER PUBLICATIONS

European Search Report dated Jul. 30, 2010 (Seven (7) pages).

(Continued)

*Primary Examiner* — Michael V Datskovskiy
(74) *Attorney, Agent, or Firm* — Crowell & Moring LLP

(57) ABSTRACT

A power conversion apparatus includes a power module, four corners of which are fastened to a cooling jacket from its front surface by a front surface side fastening apparatus that includes nuts which are screwed with bolts projecting from the rear face of the cooling jacket to fasten the power module. An AC terminal of the power module, a DC positive electrode terminal connection portion, and a DC negative electrode terminal are arranged on the top surface of the cooling jacket facing the bolts.

10 Claims, 22 Drawing Sheets

U.S. PATENT DOCUMENTS

| | | | |
|---|---|---|---|
| 7,142,434 B2 * | 11/2006 | Beihoff et al. | 361/818 |
| 7,417,861 B2 * | 8/2008 | Kikuchi et al. | 361/718 |
| 7,487,581 B2 * | 2/2009 | Obu et al. | 29/602.1 |
| 7,511,961 B2 * | 3/2009 | Tschirbs et al. | 361/704 |
| 7,547,966 B2 * | 6/2009 | Funakoshi et al. | 257/707 |
| 7,561,429 B2 * | 7/2009 | Yahata et al. | 361/715 |
| 7,719,838 B2 * | 5/2010 | Nakajima et al. | 361/699 |
| 7,755,898 B2 * | 7/2010 | Aoki et al. | 361/710 |
| 7,760,503 B2 * | 7/2010 | Aoki et al. | 361/699 |
| 7,800,222 B2 * | 9/2010 | Schulz et al. | 257/723 |
| 2001/0014029 A1 | 8/2001 | Suzuki et al. | |
| 2003/0133282 A1 | 7/2003 | Beihoff et al. | |
| 2007/0246635 A1 * | 10/2007 | Nakajima et al. | 248/637 |
| 2007/0253164 A1 * | 11/2007 | Matsuo et al. | 361/699 |
| 2008/0049476 A1 | 2/2008 | Azuma et al. | |
| 2008/0117602 A1 * | 5/2008 | Korich et al. | 361/715 |

FOREIGN PATENT DOCUMENTS

| | | |
|---|---|---|
| EP | 1 881 590 A2 | 1/2008 |
| JP | 8-182156 A | 7/1996 |
| JP | 10-173112 A | 6/1998 |
| JP | 2001-35982 A | 2/2001 |
| JP | 2001-308246 A | 11/2001 |
| JP | 2004-266973 A | 9/2004 |
| JP | 2005-33140 A | 2/2005 |
| JP | 2007-282370 | 10/2007 |
| JP | 2008-29117 A | 2/2008 |

OTHER PUBLICATIONS

Japanese Office Action dated Oct. 1, 2010 (Three (3) pages).

* cited by examiner

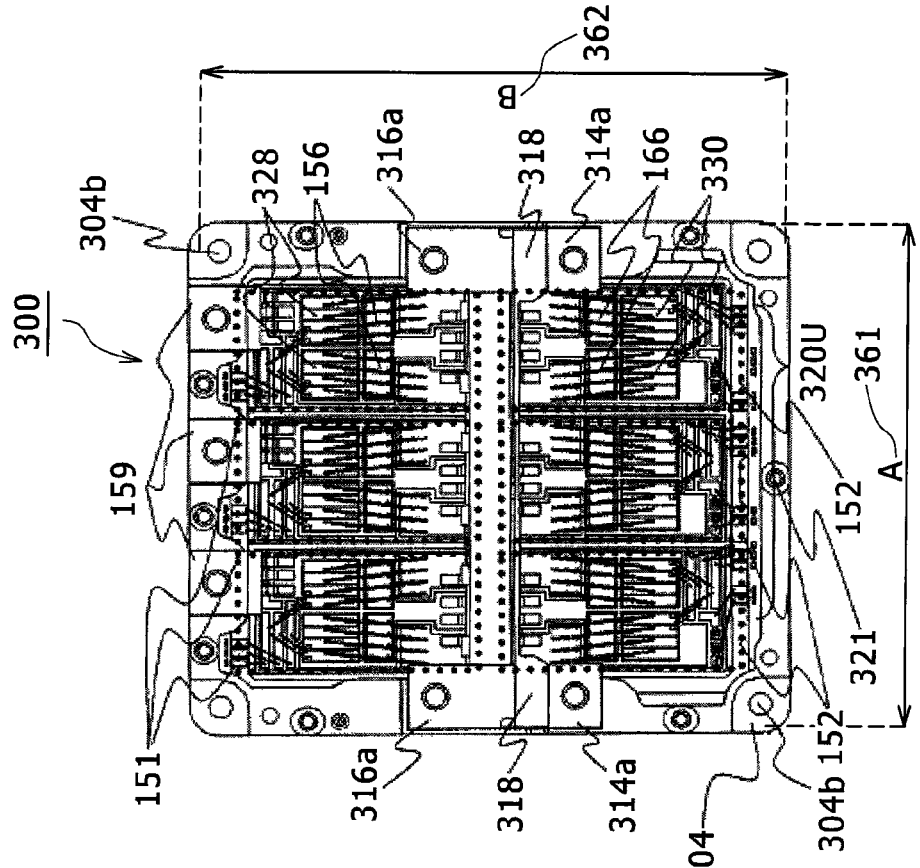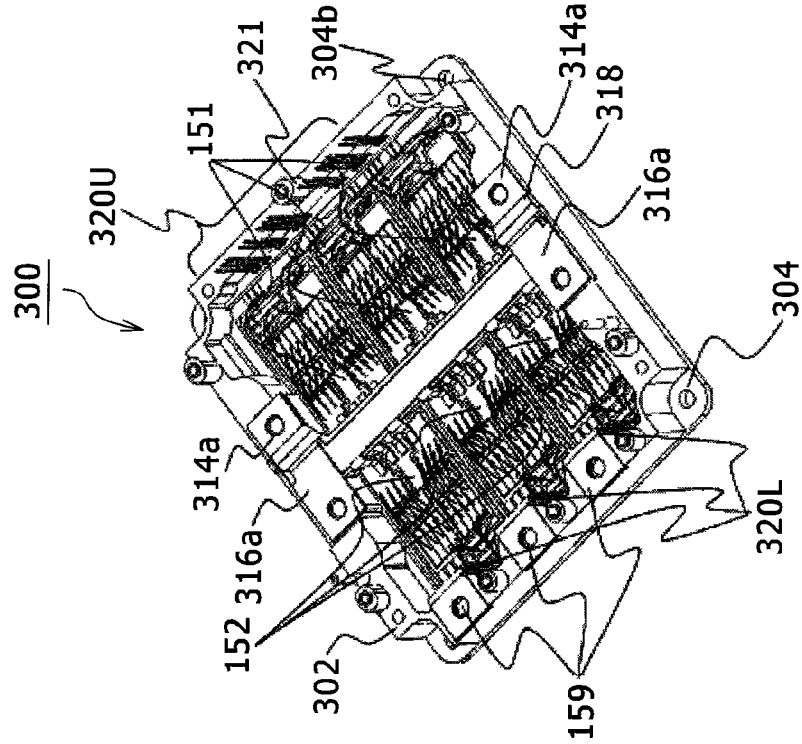

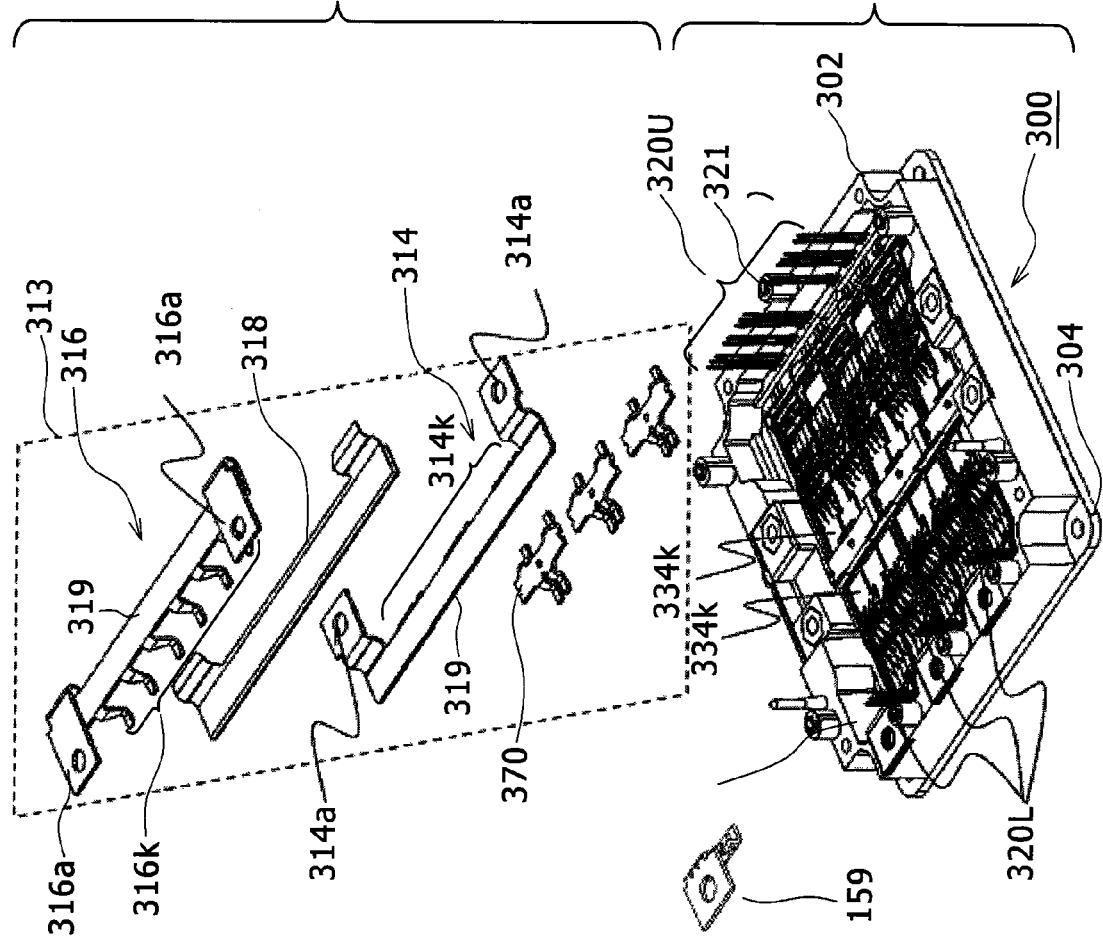

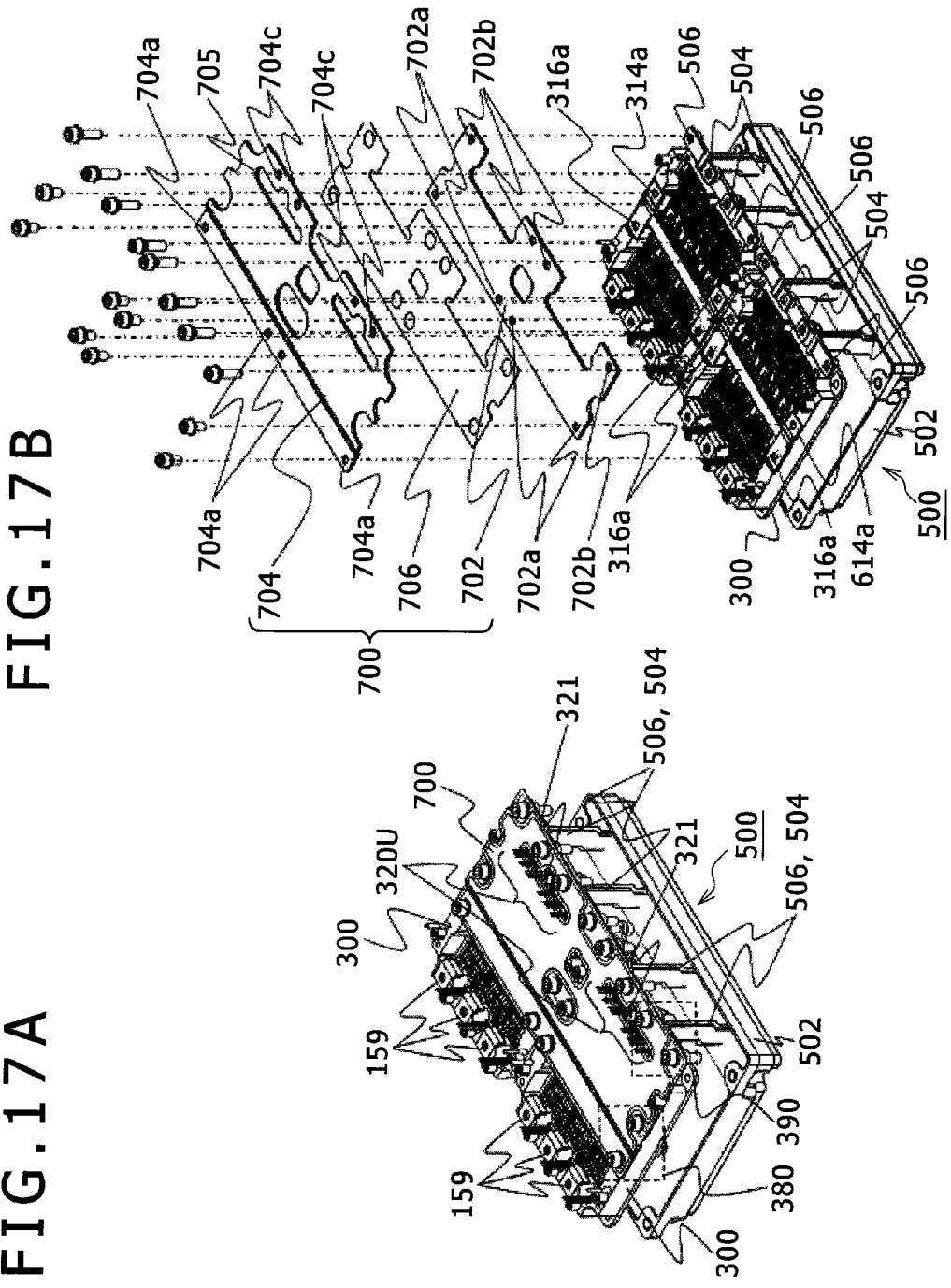

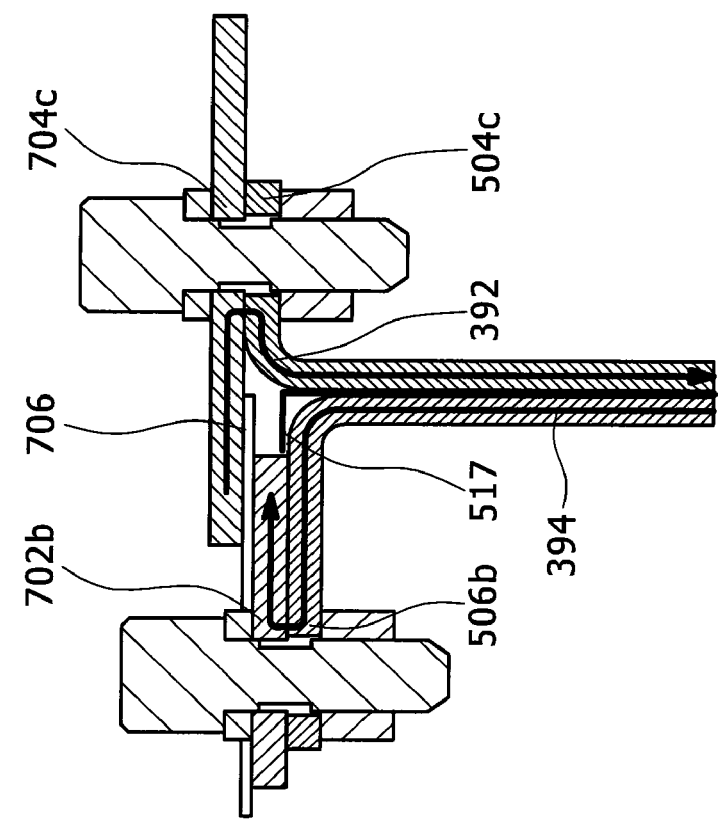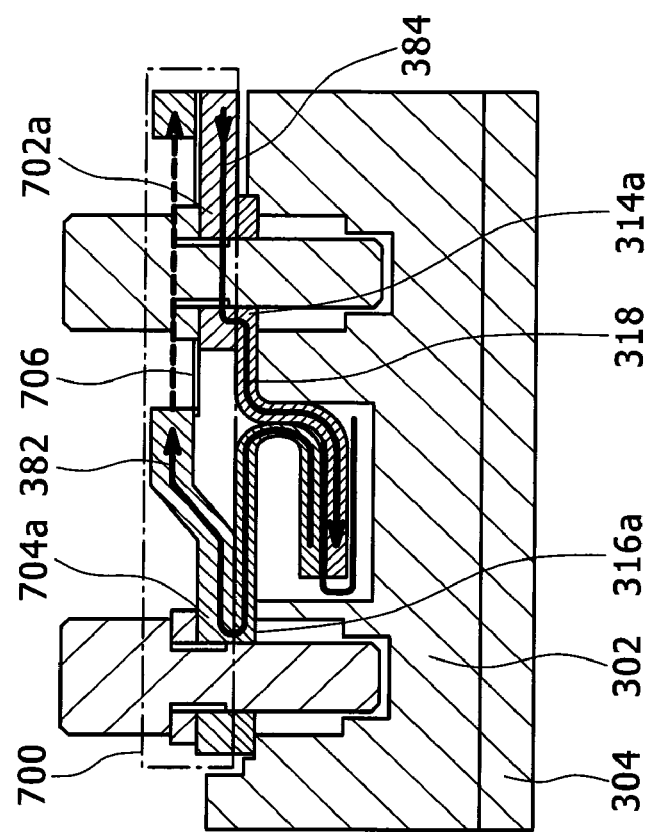

POWER CONVERSION APPARATUS AND POWER MODULE

FIELD OF THE INVENTION

The present invention relates to a power conversion apparatus that is required to be downsized, for example, a power conversion apparatus suitable for use in a vehicle, and a power module used in the power conversion apparatus.

BACKGROUND OF THE INVENTION

In order to fasten a conventional power module to a power conversion apparatus housing or the like, the power module is fastened to the device with a fastener member such as a bolt from the same direction as a fixing direction. Therefore, there is a need to ensure a tool space above an upper surface of the power module. Under the circumstances, diverse components of the power module are mounted away from the above space so as not to interfere with a tool. For that reason, there is a limit to the effective utilization of a space where the power module components are mounted. An example of a real fastening manner is disclosed in JP-A-2007-282370.

SUMMARY OF THE INVENTION

As described above, in the conventional power conversion apparatus, it is difficult to ensure the mounting area of switching elements inside of the power module, and reduce the size of the entire power module.

According to a first aspect of the present invention, there is provided a power conversion apparatus including: a housing having a cooling jacket with a flow passage of a coolant; a power module having a semiconductor circuit that executes power conversion between a DC power and an AC power mounted on a front surface thereof, and a radiator that executes heat exchange with the coolant disposed on a rear surface thereof; and a fastening unit that fastens the power module to the cooling jacket to seal the flow passage, the fastening unit including a front-surface side fastening part that fastens the power module to the cooling jacket by fastening operation from the front surface side of the power module, and a rear-surface side fastening part that fastens the power module to the cooling jacket by fastening operation from the rear surface side of the power module, wherein at least one of components of the power module, for example, an input and output terminal is disposed on the front surface area of the power module opposite to the rear-surface side fastening part.

According to a second aspect of the present invention, there is provided a power module comprising: an inverter device that executes power conversion between a DC power and an AC power; a metal base having a switching element of the inverter device mounted on a surface thereof, and a radiation fin projected from a rear surface thereof; a case member disposed in the periphery of the metal base so as to surround the switching element; at least one terminal of input and output terminals for the DC power and the AC power, which is disposed on an upper surface of the case member; and a fastening member disposed on the rear surface of the metal base for fastening the metal base to the housing from the rear surface side thereof.

According to the present invention, the front surface area of the power module which faces at least the rear-surface side fastening part among the front surface side of the power module can be utilized as an installation area of diverse parts constituting the power module. In the installation area can be disposed diverse electric input and output terminals. As a result, the power module can be downsized while the mounting area of the semiconductor circuit that executes power conversion, thereby enabling the entire power conversion apparatus to be downsized.

BRIEF DESCRIPTION OF THE DRAWINGS

FIG. 8A is an upward perspective view showing a power module according to the embodiment, and FIG. 8B is a top view showing the power module;

FIGS. 9A and 9B are exploded perspective views showing a DC terminal of the power module according to the embodiment, FIG. 9A being a diagram showing a configuration in which a metal base and one of three upper and lower arm series circuits being components of the power module are extracted, and FIG. 9B being an exploded perspective view showing the metal base, a circuit wiring pattern, and an insulating substrate;

FIG. 17A is a perspective view showing the power conversion apparatus according to this embodiment, from which only the capacitor module, a DC side conductor plate, and two power modules are removed, and FIG. 17B is an exploded perspective view of the DC side conductor plate;

FIGS. 18A and 18B are enlarged diagrams showing a connection portion of the power module and the DC side conductor plate shown in FIGS. 17A and 17B;

DETAILED DESCRIPTION OF THE PREFERRED EMBODIMENTS

Figure 1:
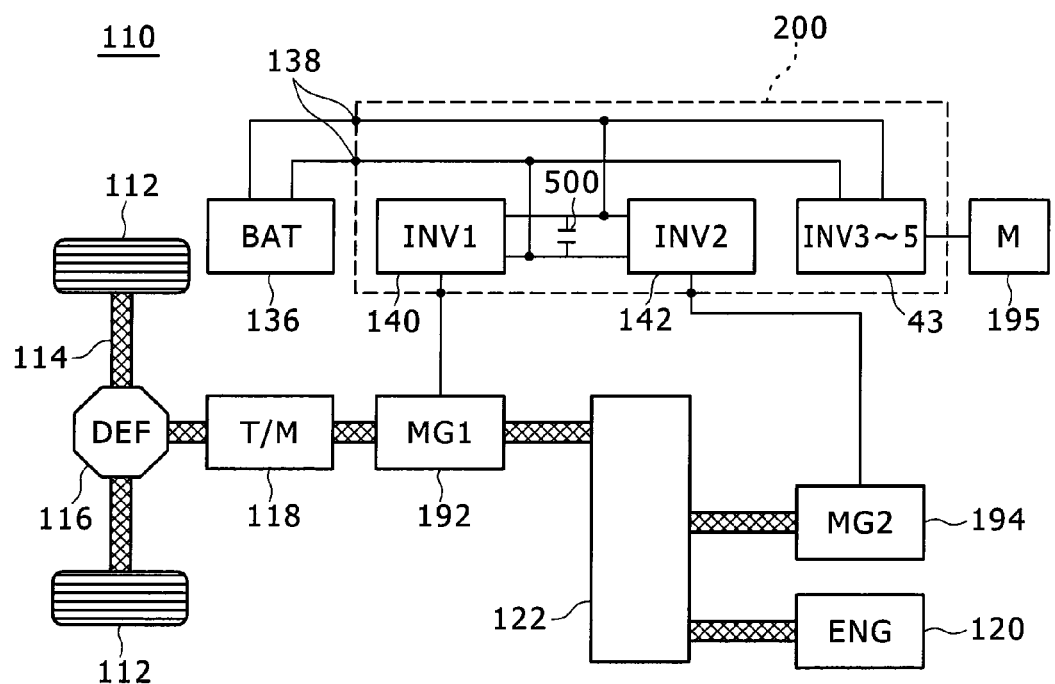
FIG. 1 is a diagram showing a control block of a hybrid vehicle.

A power conversion apparatus according to an embodiment of the present invention will be described in more detail below with reference to the accompanying drawings. The power conversion apparatus according to the embodiment of the present invention is applicable to a hybrid vehicle or a pure electric vehicle. As a typical example, a control configuration when the power conversion apparatus according to the embodiment of the present invention is applied to the hybrid vehicle, and a circuit configuration of the power conversion apparatus will be described with reference to FIGS. 1 and 2. FIG. 1 is a diagram showing a control block of the hybrid vehicle.

The power conversion apparatus according to the embodiment of the present invention will be described with an example of a vehicle drive inverter device which is used in a vehicle power conversion apparatus for an in-vehicle electric system which is mounted in a vehicle, more particularly, in a vehicle drive electric system, and is very severe in in-vehicle environment, operative environment, etc. The vehicle drive inverter device is equipped in the vehicle drive electric system as a control unit that controls the driving operation of a vehicle drive electric motor. The vehicle drive inverter device converts a DC power supplied from an in-vehicle battery or an in-vehicle power generator which constitutes an in-vehicle power supply into a given AC power, and supplies the obtained AC power to the vehicle drive electric power to control the driving operation of the vehicle drive electric motor. Since the vehicle drive electric motor also functions as a power generator, the vehicle drive inverter device also has a function of converting an AC power generated by the vehicle drive electric motor into a DC power. The converted DC power is supplied to the in-vehicle battery.

The configuration of this embodiment is best suited for the vehicle drive power conversion apparatus for use in an automobile, a truck, or the like. However, the configuration is also applicable to other power conversion apparatuses, for example, a power conversion apparatus for use in an electric train, a ship, an airplane, etc., an industrial power conversion apparatus used as a control unit for an electric motor that drives the facility of a factory, and a domestic power conversion apparatus for use in a domestic photovoltaic power system or a control unit for an electric motor that drives a domestic electric appliance.

Referring to FIG. 1, a hybrid electric vehicle (hereinafter referred to as "HEV") 110 is one electric vehicle, and equipped with two vehicle drive systems. One vehicle drive system is an engine system with an engine 120 being an internal combustion engine as a power source. The engine system is mainly used as a drive source of the HEV. Another vehicle drive system is an in-vehicle electric system with motor generators 192 and 194 as a power source. The in-vehicle electric system is mainly as the drive source of the HEV and a power generation source of the HEV. The motor generators 192 and 194 are, for example, a synchronous machine or an induction machine, and operate as the motor and also as the power generator according to the driving method, which are therefore called "motor, generator" in the present specification.

A front wheel shaft 114 is rotatably axially supported in a front portion of a chassis. A pair of front wheels 112 is disposed on both ends of the front wheel shaft 114. A rear wheel shaft (not shown) is rotatably axially supported on a rear portion of the chassis. A pair of rear wheels is disposed on both ends of the rear wheel shaft. The HEV according to this embodiment employs a so-called front wheel drive system in which main wheels driven by a motive energy are the front wheels 112, and driven wheels are the rear wheels. Conversely, there may be employed a rear wheel drive system.

A front wheel side differential gear (hereinafter referred to as "DEF") 116 is disposed in the center of the front wheel shaft 114. The front wheel shaft 114 is mechanically connected to an output side of the front wheel side DEF 116. An input side of the front wheel side DEF 116 is mechanically connected to an output shaft of a transmission 118. The front wheel side DEF 116 is a differential electric power distribution mechanism that distributes a rotary drive force changed and transmitted by the transmission 118 to the right and left front wheel shafts 114. An input side of the transmission 118 is mechanically connected with an output side of the motor generator 192. An input side of the motor generator 192 is mechanically connected with an output side of the engine 120 and an output side of the motor generator 194 through a power transfer mechanism 122. The motor generators 192, 194 and the power transfer mechanism 122 are housed within the housing of the transmission 118.

The motor generators 192 and 194 are synchronous machines having a permanent magnet in a rotor, and an AC power supplied to an armature winding of a stator is controlled by inverter devices 140 and 142 to control the driving operation of the motor generators 192 and 194. The inverter devices 140 and 142 are electrically connected with a battery 136, and the electric power can be mutually transferred between the battery 136 and the inverter devices 140, 142.

In this embodiment, there are provided two units consisting of a first electric power generation unit including the motor generator 192 and the inverter device 140, and a second electric power generation unit including the motor generator 194 and the inverter device 142. Then, those units are selectively used according to the driving state. That is, in the case where the vehicle is driven by the motive energy from the engine 120, in assisting the drive torque of the vehicle, the first electric power generation unit is actuated as the power generation unit by the motive energy of the engine 120 to generate an electric power, and the first electric power generation unit is actuated by the electric power obtained by that power generation as the electric power unit. Also, in the same case, in assisting the vehicle speed, the first electric power generation unit is actuated as the power generation unit by the motive energy of the engine 120 to generate an electric power, and the second electric power generation unit is actuated by the electric power obtained by that power generation as the electric power unit.

Also, in this embodiment, the first electric power generation unit is actuated by the electric power of the battery 136 as the electric power unit, thereby enabling the vehicle to be driven by only the motive energy of the motor generator 192. Further, in this embodiment, the first electric power generation unit or the second electric power generation unit are actuated as the electric power generation unit by the motive energy of the engine 120 or the motive energy from the wheels, thereby enabling the battery 136 to be charged.

The battery 136 is also used as a power supply for driving a motor 195 for auxiliaries. The auxiliary machine is, for example, a motor for driving a compressor of an air conditioner, or a motor for driving a hydraulic pump for control. A DC power is supplied from the battery 136 to an inverter device 43, converted into an AC power by the inverter device 43, and then supplied to the motor 195. The inverter device 43 has the same function as that of the inverter devices 140 and 142, and controls the phase, the frequency, and the electric power of AC supplied to the motor 195. For example, the inverter device 43 supplies the AC power of a leading phase with respect to the rotation of the rotor of the motor 195, thereby allowing the motor 195 to generate a torque. On the other hand, the inverter device 43 supplies the AC power of a lagging phase, thereby allowing the motor 195 to function as the power generator, and the motor 195 operates in a regenerative braking state. The control function of the inverter device 43 is the same as the control function of the inverter devices 140 and 142. Since the capacity of the motor 195 is smaller than the capacity of the motor generators 192 and 194, the maximum conversion power of the inverter device 43 is smaller than that of the inverter devices 140 and 142, but the circuit configuration of the inverter device 43 is basically identical with the circuit configuration of the inverter devices 140 and 142.

The inverter device 140, the inverter device 142, the inverter device 43, and a capacitor module 500 have an electrically close relationship with each other. Also, that a countermeasure to heat generation is necessary is common to those members. Further, it is desirable that the volume of the devices is made as small as possible. From the above viewpoints, in the power conversion apparatus described in more detail below, the inverter devices 140, 142, the inverter device 43, and the capacitor module 500 are built within the housing of the power conversion apparatus. The above configuration enables the apparatus small in size and high in reliability to be realized.

Also, the inverter device 140, the inverter device 142, the inverter device 43, and the capacitor module 500 are built into one housing, to thereby simplify the wiring and performing noise suppression. Also, inductances of connection circuits between the capacitor module 500, and the inverter device 140, the inverter device 142, the inverter device 43 can be reduced, thereby enabling a spike voltage to be reduced, and a reduction in heat generation and an improvement in heat radiation efficiency to be performed.

Figure 2:
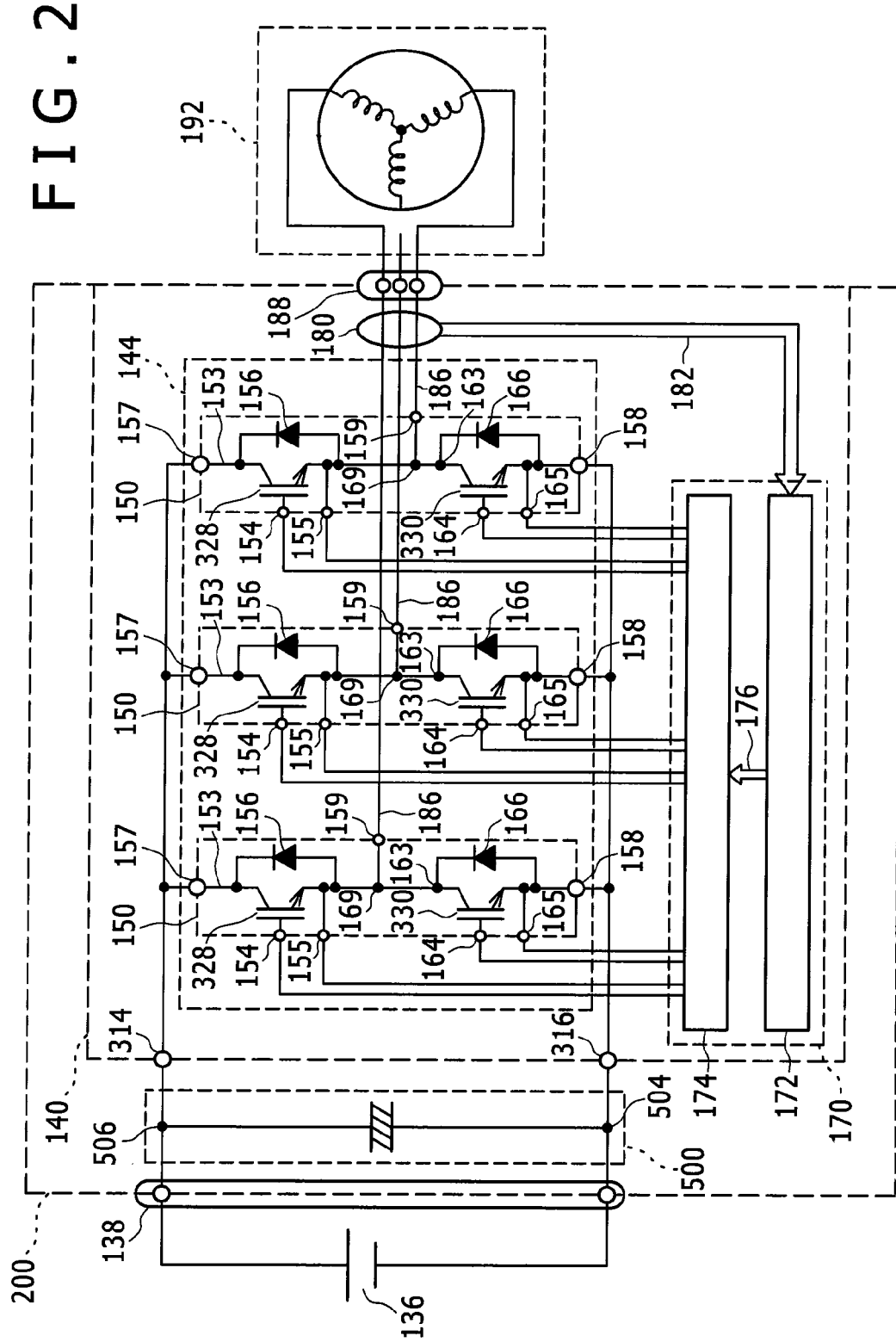
FIG. 2 is a diagram for explaining an electric circuit configuration of any one of inverter devices.

Subsequently, the electric circuit configuration of the inverter device 140, the inverter device 142 or the inverter device 43 will be described with reference to FIG. 2. In the embodiment shown in FIGS. 1 and 2, an example in which the inverter device 140, the inverter device 142, and the inverter device 43 are constructed, independently, will be described. The inverter device 140, the inverter device 142, and the inverter device 43 are identical in configuration, action and function with each other, and therefore as a typical example, the inverter device 140 will be described.

A power conversion apparatus 200 according to this embodiment includes the inverter device 140 and the capacitor module 500. The inverter device 140 has an inverter circuit 144 being a semiconductor circuit, and a control portion 170. Also, the inverter circuit 144 has a plurality of upper and lower arm series circuits 150 each including an IGBT 328 (insulating gate bipolar transistor) and a diode 156, which operate as an upper arm, and an IGBT 330 and a diode 166, which operate as a lower arm (in an example of FIG. 2, three upper and lower arm series circuits 150). The inverter circuit 144 is configured to connect to an AC power line (AC bus bar) 186 for a motor generator 192 from an intermediate portion (intermediate electrode 169) of each upper and lower arm series circuit 150 via each AC terminal 159. Also, the control portion 170 has a driver circuit 174 that drives the inverter circuit 144 under the control, and a control circuit 172 that supplies a control signal to the driver circuit 174 via a signal line 176.

The IGBTs 328 and 330 of the upper arm and the lower arm are switching power semiconductor elements, and operate upon receiving a drive signal output from the control portion 170, and convert a DC power supplied from the battery 136 into a three-phase AC power. The converted electric power is supplied to the armature winding of the motor generator 192.

The inverter circuit 144 is made up of a three-phase bridge circuit, and the three upper and lower arm series circuits 150 for three phases are electrically connected in parallel between a DC positive terminal 314 and a DC negative terminal 316 which are electrically connected to a positive electrode side and a negative electrode side of the battery 136, respectively.

In this embodiment, the IGBTs 328 and 330 are used as the switching power semiconductor elements. The IGBTs 328 and 330 include collector electrodes 153, 163, emitter electrodes (signal emitter electrode terminals 155, 165), and gate electrodes (gate electrode terminals 154, 164), respectively. The diodes 156 and 166 are electrically connected between collector electrodes 153 and 163 and emitter electrodes of the IGBTs 328 and 330, as shown in FIG. 2. The diodes 156 and 166 each have two electrodes of a cathode electrode and an anode electrode. The cathode electrodes are electrically connected to the collector electrodes of the IGBTs 328 and 330, and the anode electrodes are electrically connected to the emitter electrodes of the IGBTs 328 and 330, respectively, so that a direction from the emitter electrodes of the IGBTs 328 and 330 toward the collector electrodes thereof is a forward direction. The switching power semiconductor element may be formed of a MOSFET (metal oxide semiconductor field effect transistor). In this case, no diode 156 and no diode 166 are required.

The upper and lower arm series circuits 150 are disposed for three phases corresponding to the respective phase windings of the armature winding of the motor generator 182. The three upper and lower arm series circuits 150 correspond to a U-phase, a V-phase, and a W-phase, respectively, and form the U-phase, the V-phase, and the W-phase for the motor generator 192 through the intermediate electrodes 169 that connect the emitter electrodes of the IGBTs 328 and the collector electrodes 163 of the IGBTs 330, and the AC terminals 159, respectively. The upper and lower arm series circuits are electrically connected in parallel to each other. The collector electrode 153 of the IGBT 328 of the upper arm is electrically connected (connected by the DC bus bar) to the positive electrode side capacitor electrode of the capacitor module 500 through a positive terminal (P terminal) 157. The emitter electrode of the IGBT 330 of the lower arm is electrically connected (connected by the DC bus bar) to the negative electrode side capacitor electrode of the capacitor module 500 through a negative terminal (N terminal) 158. The intermediate electrode 169 being at the intermediate portion of each arm (a connection portion between the emitter electrode of the IGBT 328 of the upper arm and the collector electrode of the IGBT 330 of the lower arm is electrically connected to the corresponding winding of the armature winding of the motor generator 192 through the AC terminal 159 and an AC connector 188, respectively.

The capacitor module 500 constitutes a smoothing circuit that suppresses a variation in the DC voltage caused by the switching operation of the IGBTs 328 and 330. The positive electrode side capacitor electrode of the capacitor module 500 is electrically connected with the positive electrode side of the battery 136 through a DC connector 138, and the negative electrode side capacitor electrode of the capacitor module 500 is electrically connected with the negative electrode side of the battery 136 through the DC connector 138. With the above configuration, the capacitor module 500 is connected between the collector electrodes 153 of the upper arm IGBTs 328 and the positive electrode sides of the battery 136 and between the emitter electrodes of the lower arm IGBTs 330 and the negative electrode side of the battery 136, and electrically connected in parallel to the battery 136 and the upper and lower arm series circuits 150.

The control portion 170 is configured to operate the IGBTs 328 and 330, and includes the control circuit 172 that generates a timing signal for controlling the switching timing of the IGBTs 328 and 330 on the basis of input information from another control unit, a sensor, or the like, and the drive circuit 174 that generates a drive signal for allowing the IGBTs 328 and 330 to execute the switching operation on the basis of the timing signal output from the control circuit 172.

The control circuit 172 has a microcomputer for arithmetically processing the switching timing of the IGBTs 328 and 330. To the microcomputer is input, as input information, a target torque value required for the motor generator 192, a current value supplied to the armature winding of the motor generator 192 from the upper and lower arm series circuits 150, and a magnetic pole position of the rotor of the motor generator 192. The target torque value is based on a command signal output from a higher control unit not shown. The current value is detected on the basis of a detection signal output from a current sensor 180. The magnetic pole position is detected on the basis of a detection signal output from a rotary magnetic pole sensor (not shown) disposed in the motor generator 192. In this embodiment, an example in which three-phase current values are detected will be described. Alternatively, current values for two phases may be detected.

The microcomputer within the control circuit 172 arithmetically calculates current command values for d- and q-shafts of the motor generator 192 on the basis of the target torque value. The microcomputer arithmetically calculates the voltage command values of d- and q-shafts on the basis of a difference between the calculated current command values of the d- and q-shafts, and the detected current values of the d- and q-shafts. The microcomputer then converts the voltage command value of the d- and q-shafts into the voltage command values of the U-phase, the V-phase, and the W-phase on the basis of the detected magnetic pole position. Then, the microcomputer generates a pulse modulation wave on the basis of a comparison of a fundamental wave (sine wave) based on the voltage command values of the U-phase, the V-phase, and the W-phase with a carrier wave (chopping wave), and outputs the generated modulation wave to the driver circuit 174 as a PWM (pulse width modulation) signal.

When driving each lower arm, the driver circuit 174 amplifiers the PWM signal, and outputs the amplified PWM signal as a drive signal to the gate electrode of the IGBT 330 of the corresponding lower arm. When driving each upper arm, the driver circuit 174 amplifiers the PWM signal after shifting the level of a reference potential of the PWM signal to the level of a reference potential of the upper arm, and outputs the amplified PWM signal as a drive signal to the gate electrode of the IGBT 328 of the corresponding higher arm. With the above operation, each of the IGBTs 328 and 330 executes the switching operation on the basis of the input drive signal.

Also, the control portion 170 executes abnormality detection (overcurrent, overvoltage, overtemperature, etc.), and protects the upper and lower arm series circuits 150. For that reason, sensing information is input to the control portion 170. For example, information on currents flowing in the emitter electrodes of the respective IGBTs 328 and 330 is input to the corresponding drive portion (IC) from the signal emitter electrode terminals 155 and 165 of the respective arms. As a result, each drive portion (IC) executes overcurrent detection, and stops, when detecting the overcurernt, the switching operation of the corresponding IGBTs 328 and 330, and protects the corresponding IGBTs 328 and 330 from overcurrent. From a temperature sensor (not shown) disposed in each upper and lower series circuit 150, information on the temperature of the upper and lower arm series circuit 150 is input to the microcomputer. Also, to the microcomputer is input information on the voltage on the DC positive electrode side of the upper and lower arm series circuit 150. The microcomputer executes the overtemperature detection and the overvoltage detection on the basis of those information, and stops, when detecting overtemperature or overvoltage, the switching operation of all the IGBTs 328 and 330, and protects the upper and lower arm series circuit 150 (furthermore, the semiconductor module including that circuit 150) from overtemperature or overvoltage.

The conduction and interruption operation of the IGBTs 328 and 330 of the upper and lower arms in the inverter circuit 144 changes over in a given order, and a current generated in the stator winding of the motor generator 192 when changing over the operation flows in a circuit including the diodes 156 and 166.

The upper and lower arm series circuits 150 each include, as shown in the figure, the positive terminal (P-terminal) 157, the negative terminal (N-terminal) 158, the AC terminal 159 connected to the intermediate electrode 169 of the upper and lower arms, the signal terminal (signal emitter electrode terminal) 155 of the upper arm, the gate electrode terminal 154 of the upper arm, the signal terminal (signal emitter electrode terminal) 165 of the lower arm, and the gate terminal electrode 164 of the lower arm. Also, the power conversion apparatus 200 has the DC connector 138 at the input side and the AC connector 188 at the output side, and is connected to the battery 136 and the motor generator 192 through the connectors 138 and 188, respectively. Further, the circuit generating the outputs for the respective phases of three-phase AC which are output to the motor generator may be a power conversion apparatus with a circuit configuration in which two upper and lower arm series circuits are connected in parallel to each other for each phase.

Referring to FIGS. 3 to 7, reference numeral 200 denotes a power conversion apparatus, 10 is an upper case, 11 is a metal base plate, 12 is a housing, 13 is a coolant inlet pipe, 14 is a coolant outlet pipe, 420 is a lower cover, 16 is a lower case, 17 is AC terminal cases, 18 is AC terminals, 19A is a cooling jacket, 19 is a coolant flow passage within the cooling jacket 19A, and 20 is a control circuit board which holds a control circuit 172. Reference numeral 21 denotes a connector for connection to the external, 22 is a driver circuit board that holds a driver circuit 174. Reference numeral 300 denotes two of power modules (semiconductor module portions) each having an inverter circuit 144 therein. Reference numeral 700 denotes a laminated conductor plate, 800 is an O-ring, 304 is a metal base, 188 is an AC connector, 314 is a DC positive terminal, 316 is a DC negative terminal, 500 is a capacitor module, 502 is a capacitor case, 504 is a positive electrode side capacitor terminal, 506 is a negative electrode side capacitor terminal, and 514 is capacitor cells, respectively.

Figure 3:
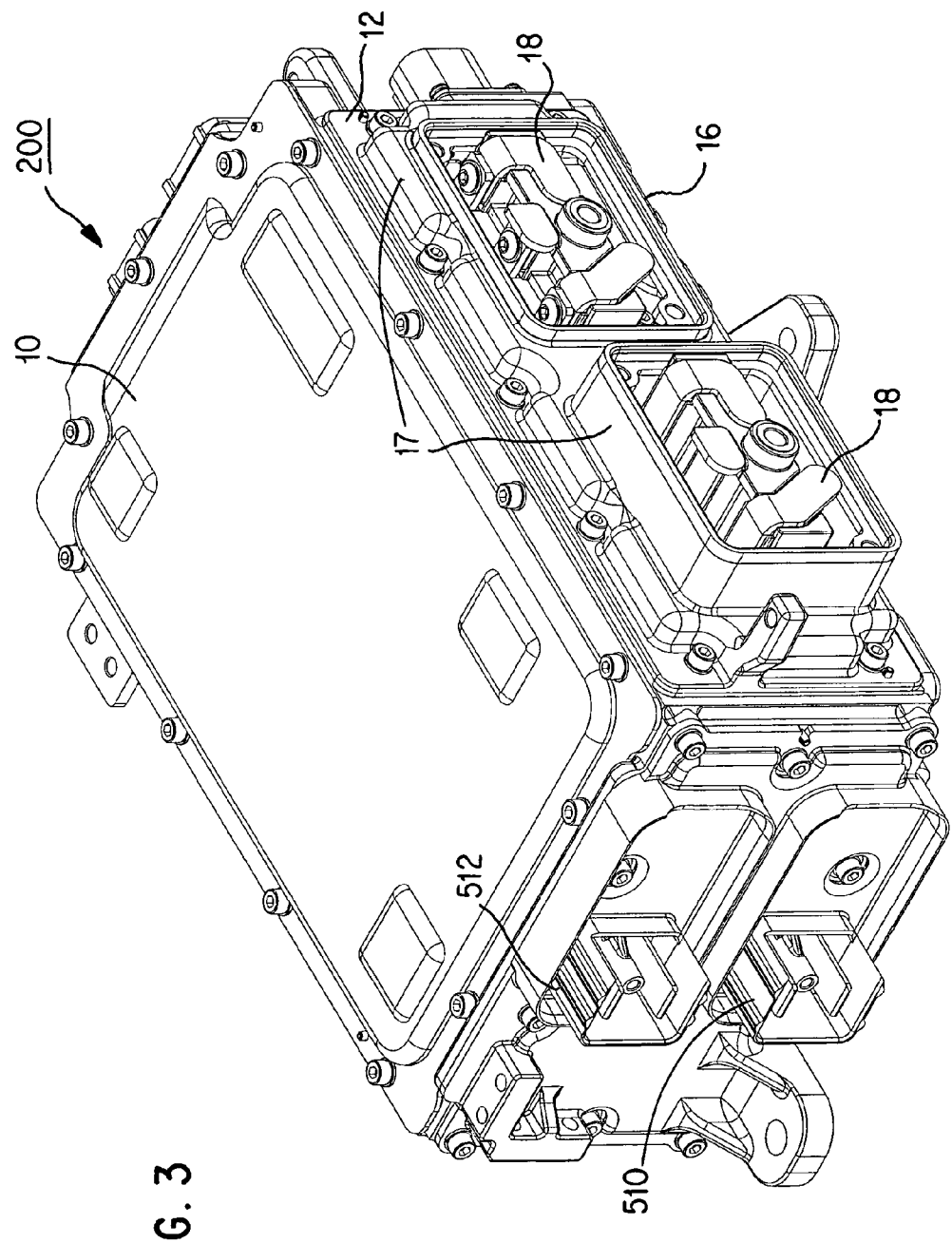
FIG. 3 is an external perspective view showing the entire configuration of a power conversion apparatus according to an embodiment of the present invention.

FIG. 3 is an external perspective view showing the entire configuration of a power conversion apparatus according to an embodiment of the present invention. The power conversion apparatus 200 according to this embodiment includes a housing 12 having a top surface or a bottom surface substantially rectangular, the coolant inlet pipe 13 and the coolant outlet pipe 14 which are disposed in one outer periphery of the housing 12 on the short side thereof, the upper case 10 for closing the upper opening of the housing 12, and a lower case 16 for closing the lower opening of the housing 12. Since the bottom surface or the top surface of the housing 12 is substantially rectangular in configuration, it is easy to attach the apparatus to the vehicle, and it is easy to produce the apparatus.

Two sets of AC terminal cases 17 used for connection to the motor generators 192 and 194 are disposed in the outer periphery of the power conversion apparatus 200 at the long side thereof. The AC terminals 18 are used to electrically connect the power modules 300 with the motor generators 192 and 194. AC currents output from the power modules 300 are transmitted to the motor generators 192 and 194 via the AC terminals 18.

The connector 21 is connected to the control circuit board 20 built into the housing 12. Diverse signals from the external are transmitted to the control circuit board 20 via the connector 21. A DC (battery) negative side connection terminal portion 510 and a DC (battery) positive side connection terminal portion 512 electrically connect the battery 136 and the capacitor module 500. In this embodiment, the connector 21 is disposed on one of the outer peripheral surfaces of the housing 12 at the short side thereof. On the other hand, the DC (battery) negative electrode side connection terminal portion 510 and the DC (battery) positive side connection terminal portion 512 are disposed on the outer peripheral surface at the short side opposite to the surface on which the connector 21 is disposed. That is, the connector 21 and the DC (battery) negative side connection terminal portion 510 are arranged apart from each other. With the above configuration, noises entering the housing 12 from the DC (battery) negative side connection terminal portion 510, and further propagating up to the connector 21 can be reduced, thereby enabling the controllability of the motor due to the control circuit board 20 to be improved.

Figure 4:
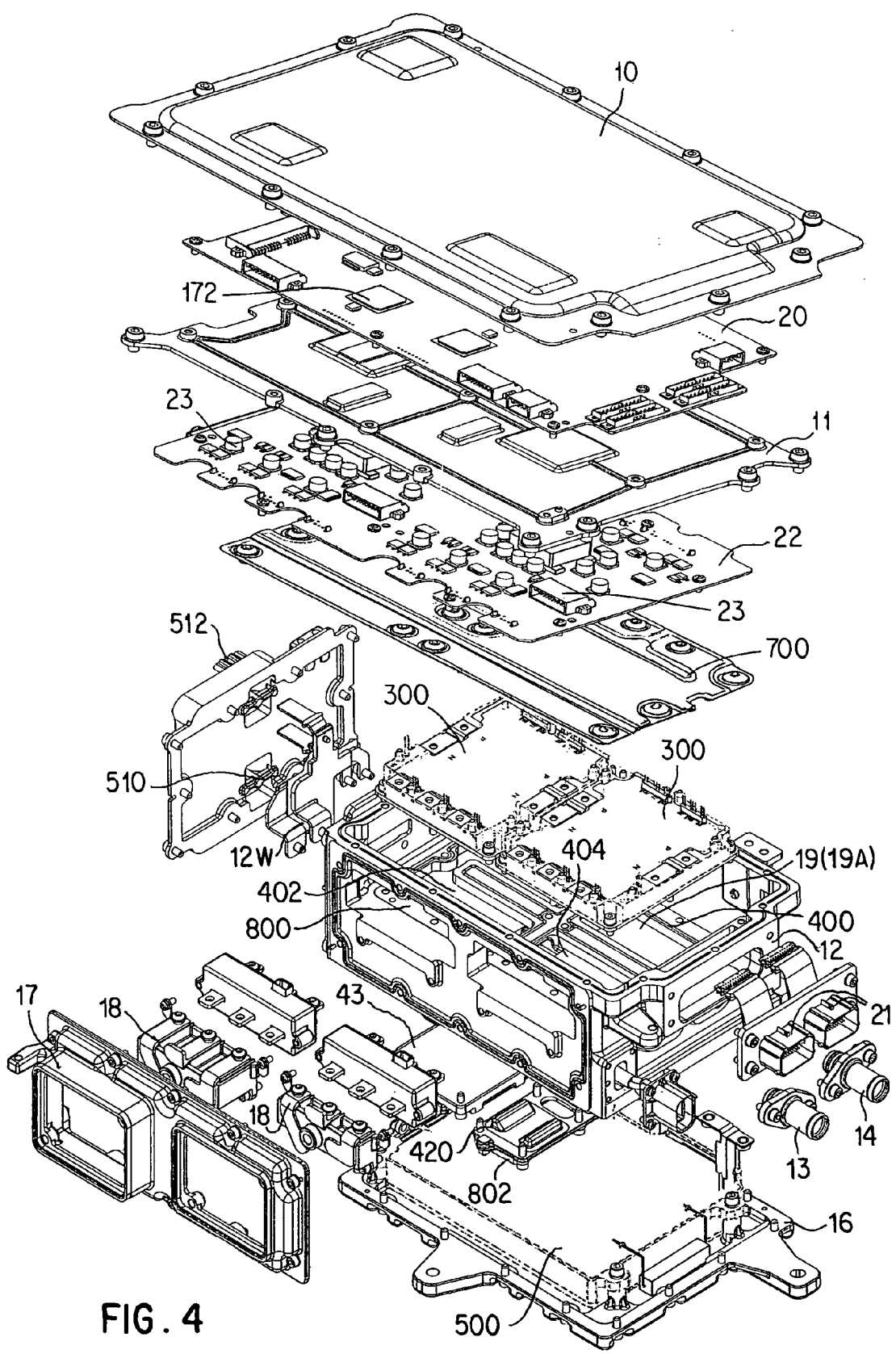
FIG. 4 is a perspective view showing the entire configuration of the power conversion apparatus according to the embodiment of the present invention being exploded into the respective components.
Figure 5:
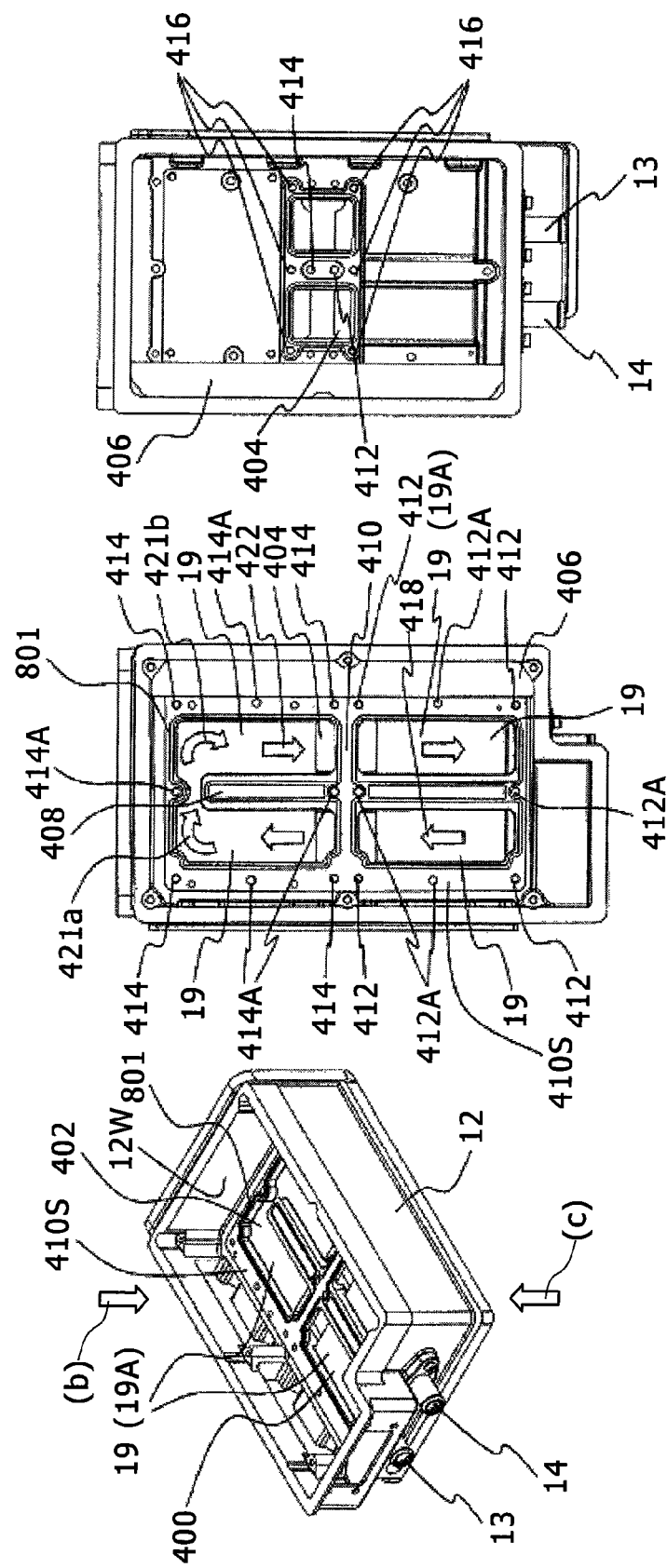
FIGS. 5A to 5C are diagrams showing a configuration in which a coolant inlet pipe and a coolant outlet pipe are fitted to an aluminum cast of a housing with a coolant flow passage, FIG. 5A being a perspective view of the housing, FIG. 5B being a top view of the housing, and FIG. 5C being a bottom view of the housing.

FIG. 4 is a perspective view showing the entire configuration of the power conversion apparatus according to the embodiment of the present invention being exploded into the respective components.

As shown in FIG. 4, the cooling jacket 19A having the coolant flow passage 19 formed therein is disposed midway in the housing 12, and two sets of openings 400 and 402 are formed on the top surface of the cooling jacket 19A so as to be arranged in a flow direction. The two power modules 300 are fixed onto the top surface of the cooling jacket 19A so as to close the two sets of openings 400 and 402. Each power module 300 is equipped with a fin 305 (refer to FIG. 7) for heat radiation, and the fins 305 (refer to FIG. 7) of the respective power modules 300 are projected into the coolant flow passages 19 from the openings 400 and 402 of the cooling jackets 19A, respectively. A structure in which the power modules 300 are fixed to the housing 12 will be described later.

An opening 404 for facilitating aluminum casting is defined in the lower surface of the cooling jacket 19A, and the opening 404 is closed by the lower cover 420. The inverter device 43 for auxiliaries is attached to the lower surface of the cooling jacket 19A. The inverter device 43 for auxiliaries has the same circuits as those in the inverter circuit 144 shown in FIG. 2 therein, and has a power module having a power semiconductor element constituting the inverter circuit 144 therein. The inverter device 43 for auxiliaries is fixed onto the lower surface of the cooling jacket 19A so that a heat radiation metal surface of the built-in power module faces the lower surface of the coolant flow passage 19. Also, the O-ring 800 for sealing is disposed between the power modules 300 and the housing 12, and an O-ring 802 is further disposed between the lower cover 420 and the housing 12. In this embodiment, the sealant is the O-ring, but the O-ring is replaced with a resin material, a liquid seal, a packing, or the like. In particular, in the case of using the liquid seal, the assembling property of the power conversion apparatus 200 can be improved.

Further, the lower case 16 is disposed below the cooling jacket 19A, and the lower case 16 is equipped with the capacitor module 500. The capacitor module 500 is fixed onto the inner surface of a bottom plate of the lower case 16 so that the heat radiation surface of the metal case comes in contact with the inner surface of the bottom plate of the lower case 16. With the above structure, the power modules 300 and the inverter device 43 can be efficiently cooled with the use of the upper surface and the lower surface of the cooling jacket 19A, thereby downsizing the entire power conversion apparatus.

The cooling water from the coolant inlet and outlet pipes 13 and 14 flows in the coolant flow passage 19, thereby cooling the heat radiation fins provided in the two power modules 300 disposed together so as to cool the entire two power modules 300. The inverter device 43 for auxiliaries disposed on the lower surface of the cooling jacket 19A is also cooled at the same time.

Further, the housing 12 having the coolant flow passage 19 formed therein is cooled, to thereby cool the lower case 16 disposed at the lower portion of the housing 12, and the heat of the capacitor module 500 is thermally conducted to the cooling water through the lower case 16 and the housing 12 to cool the capacitor module 500.

The laminated conductor plate 700 for electrically connecting the power modules 300 and the capacitor module 500 is disposed above the power modules 300. The laminated conductor plate 700 is configured over the two power modules 300 widely in the width direction of the two power modules 300. Also, the laminated conductor plate 700 is made up of a positive electrode side conductor plate 702 connected to the positive electrode side terminal of the capacitor module 500, a negative electrode side conductor plate 704 connected to the negative electrode side terminal, and an insulating member disposed between the positive electrode side terminal and the negative electrode side terminal. The above configuration enables the lamination area of the laminated conductor plate 700 to be widened, thereby making it possible to reduce a parasitic inductance from the power modules 300 to the capacitor module 500. Also, the laminated conductor plate 700, the power modules 300, and the capacitor module 500 can be electrically connected to each other after one laminated conductor plate 700 has been mounted on the two power modules 300. Therefore, even when the power conversion apparatus has two power modules 300, the man-hours of assembling such an apparatus can be suppressed.

The control circuit board 20 and the driver circuit board 22 are arranged above the laminated conductor plate 700. The driver circuit 174 shown in FIG. 2 is mounted on the driver circuit board 22, and the control circuit 172 having the CPU shown in FIG. 2 is mounted on the control circuit board 20. Also, the metal base plate 11 is disposed between the driver circuit board 22 and the control circuit board 20. The metal base plate 11 has the function of an electromagnetic shield of a circuit group mounted on both of the boards 22 and 20, and also has the action of escaping heat generated in the driver circuit board 22 and the control circuit board 20 for cooling those boards 22 and 20. As described above, the cooling jacket 19A is disposed in the center of the housing 12, the power modules 300 for vehicle drive are arranged on one side of the cooling jacket 19A, and the power module 43 for auxiliaries is disposed on, another side thereof. With the above configuration, cooling can be efficiently performed with a small space, and the entire power conversion apparatus can be downsized. The cooling jacket 19A is integrated with the housing 12 by aluminum casting whereby the cooling jacket 19A has an effect of enhancing the mechanical strength in addition to the cooling effect. Also, since the housing 12 and the cooling jacket 19A are of a casting structure, the heat conduction is enhanced to improve the cooling efficiency.

Inter-board connectors 23 that conduct connection with a circuit group of the control circuit board 20 through the metal base plate 11 are disposed on the driver circuit board 22. Also, a connector 21 that performs an electric connection with the external is disposed on the control circuit board 20. A signal transmission is conducted with respect to the in-vehicle battery 136 disposed outside of the power conversion apparatus, that is, a lithium battery module by using the connector 21. A signal indicative of a battery state and a signal indicative of a charging state of the lithium battery are transmitted to the control circuit board 20 from the lithium battery module. The signal line 176 (not shown in FIG. 4) shown in FIG. 2 is connected to the inter-board connectors 23, a switching timing signal of the inverter circuit is transmitted to the driver circuit board 22 from the control circuit board 20, and the driver circuit board 22 generates a gate drive signal, and supplies the gate drive signal to the respective gate electrodes of the power modules.

Openings are defined in the upper end and the lower end of the housing 12. Those openings are closed by fixing the upper case 10 and the lower case 16 to the housing 12 with fastener members such as screws or bolts. The center of the housing 12 in the height direction is formed with the cooling jacket 19A having the coolant flow passage 19 therein. The opening in the top surface of the cooling jacket 19A is covered with the power modules 300, and the opening in the lower surface is covered with the lower cover 420, to thereby form the coolant flow passage 19 inside of the cooling jacket 19. A water leak test of the coolant flow passage 19 is conducted during assembling. When the water leak test is passed, the operation of attaching the board and the capacitor module 500 can be then conducted through the openings in the upper portion and the lower portion of the housing 12. Thus, there is applied the structure in which the cooling jacket 19A is arranged in the center of the housing 12, and the operation of fixing necessary parts is then conducted through the openings in the upper end and the lower end of the housing 12, to thereby improve the productivity. Also, it is possible that the coolant flow passage 19 is first completed, and other parts are attached after the water leak test has been conducted, thereby improving both of the productivity and the reliability.

FIGS. 5A to 5C are diagrams showing a configuration in which the coolant inlet pipe and the coolant outlet pipe are fitted to an aluminum cast of the housing 12 with the cooling jacket 19A, FIG. 5A being a perspective view of the housing 12, FIG. 5B being a top view of the housing 12, and FIG. 5C being a bottom view of the housing 12. As shown in FIGS. 5A to 5C, the housing 12 is integrated with the cooling jacket 19A having the coolant flow passage 19 formed therein by casting. The coolant inlet pipe 13 and the coolant outlet pipe 14 for taking in the cooling water are disposed on one lateral surface of one short side of the housing 12 that are substantially rectangular in plan view.

The cooling water that has flown into the coolant flow passage 19 from the coolant inlet pipe 13 flows along the long side of the rectangle being in a direction indicated by an arrow 418, and folds back as indicated by arrows 421a and 421b in the vicinity of the lateral surface of another side of the short sides of the rectangle. The cooling water again flows in a direction indicated by an arrow 422 along the long side of the rectangle, and flows out of an outlet aperture not shown into the coolant outlet pipe 14. Four openings 400 and 402 are defined in the top surface of the cooling jacket 19A. One opening 400 is formed in each of a go path and a return path. The same is applied to the openings 402. The power modules 300 are fixed to the openings 400 and 402, respectively, and the heat radiation fins of the respective power modules 300 are projected into a flow of the cooling water from the respective openings. Two sets of the power modules 300 arranged in a direction of the flow of the cooling water, that is, along the long side of the housing 12 are so fixed as to close the opening of the cooling jacket 19A through a sealant such as the O-ring 800 in a watertight fashion.

The cooling jacket 19A traverses the middle of a housing peripheral wall 12W, and is molded integrally with the housing 12. The four openings 400 and 402 are defined in the upper surface of the cooling jacket 19A, and one opening 404 is defined in the lower surface thereof. In the respective peripheries of the openings 400 and 402 is disposed a module mounting surface 410S. A portion between the openings 400 and 402 of the mounting surface 410S is called "support portion 410". One power module 300 is fixed to the inlet/outlet side of the cooling water with respect to the support port 410, and another power module 300 is fixed to the fold-back side of the cooling water with respect to the support portion 410.

Screw holes 412 and bolt through-holes 412A shown in FIG. 5B are used to fix the power module 300 at the coolant inlet/outlet side to the mounting surface 410S, and this fixation allows the opening 400 to be sealed. Bolt holes 414 and bolt through-holes 414A are used to fix the power module 300 at the coolant fold-back side to the mounting surface 410S, and this fixation allows the opening 402 to be sealed. In this way, the respective power modules 300 are so arranged as to stride the go path and the return path of the coolant flow passage 19, thereby enabling the inverter circuit 144 to be integrated on the metal base 304 with high density. This enables the power modules 300 to be downsized, and greatly contribute to the downsized power conversion apparatus 200.

The power module 300 at the inlet/output side is cooled by cold cooling water from the coolant inlet pipe 13 and the cooling water warmed up by heat from heating parts which is closer to the outlet side. On the other hand, the power module 300 at the fold-back side is cooled by the cooling water slightly warmed and the cooling water slightly colder than the cooling water close to the outlet hole 403. As a result, the arrangement relationship between the fold-back cooling passage and the two power modules is advantageous in that the cooling efficiencies of the two power modules 300 are balanced.

The support portion 410 is used to fix the power modules 300, and necessary for the openings 400 and 402 to be sealed. Further, the support portion 410 has the great effect of increasing the strength of the housing 12. The coolant flow passage 19 is in the fold-back configuration as described above, and a partition wall 408 that separates the go-path of the flow passage and the return-path of the flow passage from each other, and the partition wall 308 are integrated with the support portion 410. The partition wall 408 is a member that separates the go-path of the flow passage and the return-path of the flow passage from each other, and also has a function of increasing the mechanical strength of the housing 12. The partition wall 408 also has a function of transferring heat to the cooling water within the go-path of the flow passage to uniform the temperature of the cooling water. When a difference in temperature of the cooling water between the inlet side and the outlet side is large, the unevenness of the cooling efficiency becomes large. Although a certain degree of temperature difference is allowed, the partition wall 408 is integrated with the support portion 410 with the effect that the temperature difference of the cooling water is suppressed.

As described above, since the cooling jacket 19A traverses the housing 12 at the middle position of the housing 12, the cooling jacket 19A functions as a reinforcement member of the housing 12. In addition, the support portion 410 and the partition wall 408 function as the reinforcement member of the cooling jacket 19A as well as the housing 12.

FIG. 5C shows a rear surface of the cooling jacket 19A, and the opening 404 is defined in the rear surface corresponding to the support portion 410. The opening 404 is to improve the yield when the support portion 410 and the housing 12 are integrated together by casting of the housing. The formation of the opening 404 eliminates a double structure of the support portion 410 and the bottom portion of the coolant flow passage 19, which facilitates casting and improves the productivity.

Also, a through-hole 406 is defined in the outer lateral portion of the cooling flow passage 19. Electric parts (the power modules 300 and the capacitor module 500) located at both sides of the cooling flow passage 19 interposed therebetween are connected to each other through the through-hole 406.

Since the housing 12 can be manufactured as an integral structure with the cooling jacket 19A, this manufacture is suitable for casting production, more particularly, aluminum die casting production.

Figure 6:
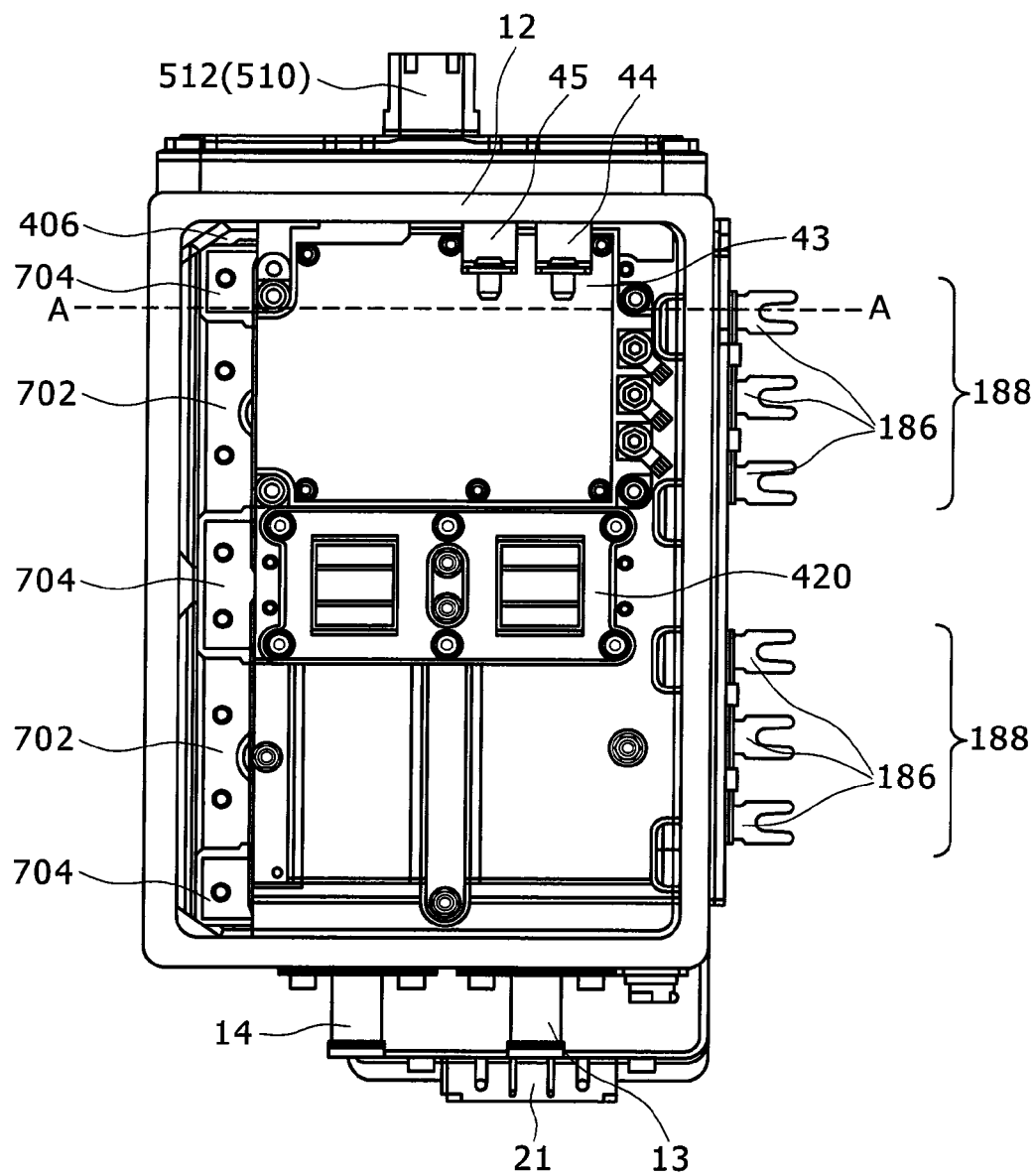
FIG. 6 is a diagram showing the details of the housing.

A state in which the power modules 300 are fixed to the upper surface opening of the jacket 19A, and the lower cover 420 is fixed to the rear surface opening is shown in FIG. 6. On one long side of the rectangle of the housing 12, the AC power line 186 and an AC connector 188 are projected toward the external of the housing.

Referring to FIG. 6, a through-hole 406 is defined in the interior of another long side of the rectangle of the housing 12, and a part of the laminated conductor plate 700 connected to the power modules 300 via the through-hole 406 is viewable. The inverter device 43 for auxiliaries is arranged in the vicinity of the side surface of the housing 12 connected with the DC (battery) positive side connection terminal portion 512. Also, the capacitor module 500 is arranged below (at an opposite side of the coolant flow passage 19) of the inverter device 43 for auxiliaries. A positive terminal for auxiliaries 44 and a negative terminal for auxiliaries 45 project downward (in a direction along which the capacitor module 500 is arranged), and are connected to a positive terminal for auxiliaries 532 at the capacitor module 500 side and a negative terminal for auxiliaries 534 at the capacitor module 500 side, respectively. With the above configuration, since a wiring distance between the capacitor module 500 and the inverter device for auxiliaries 43 is shortened, noises entering the control circuit board 20 from the positive terminal for auxiliaries 532 and the negative terminal for auxiliaries 534 at the capacitor module 500 side via the metal housing 12 can be reduced.

Also, the inverter device for auxiliaries 43 is arranged in a gap between the coolant flow passage 19 and the capacitor module 500, and the height of the inverter device for auxiliaries 43 is the same degree as that of the lower cover 420. For that reason, it is possible to cool the inverter device 43 for auxiliaries and also suppress an increase in the height of the power conversion apparatus 200.

Also, the coolant inlet pipe 13 and the coolant outlet pipe 14 are fixed by screws. In a state of FIG. 6, the water leak test of the coolant flow passage 19 can be implemented. The inverter device for auxiliaries 43 is fitted to the coolant flow passage 19 that has passed the test, and the capacitor module 500 is further attached thereto.

Figure 7:
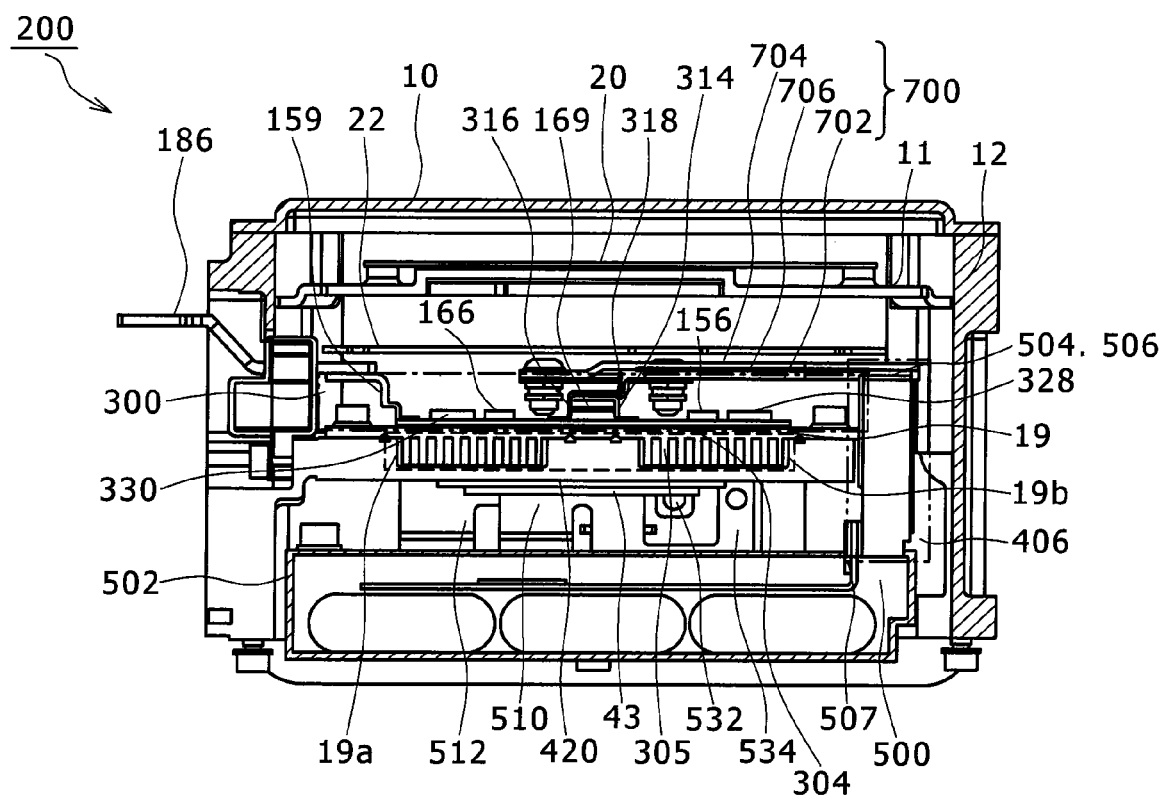
FIG. 7 is a cross-sectional view of the power conversion apparatus taken along a line A-A in FIG. 6.

FIG. 7 is a cross-sectional view of the power conversion apparatus 200 (taken along a line A-A in FIG. 6), and the basic structure has been already described with reference to FIGS. 3 to 6.

The cooling jacket 19A (a portion indicated by a dotted line in FIG. 7) made by aluminum die casting integrally with the housing 12 is disposed in the center of the section of the housing 12 in the vertical direction. The power modules (a portion indicated by a dashed line in FIG. 7) are located in the opening formed at the upper surface side of the cooling jacket 19A. A left side with respect to a paper face of FIG. 7 is a go-path 19a of the cooling water, and a right side with respect to the paper face is a return-path 19b at the fold-back side of the flow passage. The openings are disposed above the go-path 19a and the return-path 19b, respectively, as described above. The openings are closed by the metal base 304 for heat radiation of the power modules 300 so that the metal base 304 straddles both of the go-path 19a and the return-path 19b. The radiation fin 305 disposed in the metal base 304 is projected into the flow of the cooling water from the opening. Also, the inverter device for auxiliaries 43 is fixed at the lower surface side of the coolant flow passage 19.

The plate-like AC power line 186 having the substantially center bent has one end connected to the AC terminal 159 of the power modules 300, and another terminal projected from the interior of the power conversion apparatus 200 to form the AC connector. The positive electrode side capacitor terminal 504 and the negative electrode side capacitor terminal 506 are electrically and mechanically connected to the positive electrode side conductor plate 702 and the negative electrode side conductor plate 704 through the through-hole 406 (a portion indicated by a chain double-dashed line in FIG. 7), respectively. The AC connector 188, the positive electrode side capacitor terminal 504, and the negative electrode side capacitor terminal 506 are arranged in a direction substantially perpendicular to the flow direction of the cooling water inside of the coolant flow passage 19 disposed in the housing 12. For that reason, the electric wirings are arranged orderly, and the power conversion apparatus 200 is downsized. The positive electrode side conductor plate 702 and the negative electrode side conductor plate 704 of the laminated conductor plate 700, and the AC side power line 286 are projected outside of the power modules 300 to form the connection terminal. For that reason, because the electric connection structure is very simple, and another connection conductor is not used, the apparatus is downsized. This structure improves the productivity and also improves the reliability.

Further, the through-hole 406 is isolated from the coolant flow passage 19 by a frame body inside of the housing 12, and the connection portions of the positive electrode side conductor plate 702, the negative electrode side conductor plate 704, and the positive side capacitor terminal 506, the negative electrode side capacitor terminal 504 exist inside of the through-hole 406. Therefore, the reliability is improved.

In the cooling structure described above, the power modules 300 large in the heating value is fixed to one surface of the cooling jacket 19A, and the fins 305 of the power modules 300 are projected into the coolant flow passage 19 to efficiently cool the power modules 300. Then, the inverter device for auxiliaries 43 larger in the heat discharge amount is cooled by another surface of the cooling jacket 19A. Further, the capacitor module 500 large in the heating value is cooled through the housing 12 and the lower case 16. Since the cooling structure conforms to a large quantity of heat discharge, the cooling efficiency and the reliability are improved, and the power conversion apparatus 200 can be further downsized.

Further, since the inverter device for auxiliaries 43 is fixed to the bottom surface of the cooling jacket 19A facing the capacitor module 500, when the capacitor module 500 is used as a smooth capacitor of the inverter for auxiliaries 43, there is advantageous in that the wiring distance is shortened. Also, since the wiring distance is short, there is advantageous in that the inductance can be reduced.

The driver circuit board 22 mounting the driver circuit 174 thereon is arranged above the power module 300, and the control circuit board 20 is arranged above the driver circuit board 22 so as to separate from the metal base plate 11 that enhances the heat radiation and the effect of the electromagnetic shield. On the control circuit board 20 is mounted the control circuit 172 shown in FIG. 2. The upper case 10 is fixed to the housing 12, to thereby constitute the power conversion apparatus 200 according to this embodiment.

As described above, since the driver circuit board 22 is arranged between the control circuit board 20 and the power modules 300, the operating timing of the inverter circuit is transmitted from the control circuit board 20 to the driver circuit board 22, on the basis of which a gate signal is produced by the driver circuit board 22, and supplied to the gates of the power modules 300, respectively. Since the control circuit board 20 and the driver circuit board 22 are thus arranged along the electric connection relationship, the electric wiring can be simplified, and the power conversion apparatus 200 can be downsized. Also, the driver circuit board 22 is arranged at a distance closer to the control circuit board 20 than the power modules 300 and the capacitor module 500. For that reason, a wiring distance from the driver circuit board to the driver circuit board 20 is shorter than the wiring distances between other parts (power modules 300, etc.) and the control circuit board 20. Hence, electromagnetic noises transferred from the DC positive electrode side connection terminal portion 512 and electromagnetic noises caused by the switching operation of the IGBTs 328 and 330 can be prevented from entering the wiring between the driver circuit board 22 and the control circuit board 20.

The power modules 300 are fixed to one surface of the cooling jacket 19A, and the inverter device for auxiliaries 43 is fixed to another surface thereof, thereby cooling the power modules 300 and the inverter device for auxiliaries 43 by the cooling water flowing into the coolant flow passage 19 at the same time. In this case, since the power modules 300 is larger in the cooling effect since the fins for heat radiation come in direct contact with the cooling water of the coolant flow passage 19. Further, the housing 12 is cooled by the cooling water flowing into the coolant flow passage 19, and also the lower case 16 and the metal base plate 11 which are fixed to the housing 12 are cooled. Since the metal case of the capacitor module 500 is fixed to the lower case 16, the capacitor module 500 is cooled by the cooling water through the lower case 16 and the housing 12. Further, the control circuit board 20 and the driver circuit board 22 are cooled through the metal base plate 11. The lower case 16 is also made of a material excellent in heat conductivity, receives heating from the capacitor module 500, conducts heat to the housing 12, and the transferred heat is radiated by the cooling water in the coolant flow passage 19. Also, the inverter device for auxiliaries 43 which is relatively small in capacity, which is used for an in-vehicle air conditioner, an oil pump, and other-use pump is located on the lower surface of the cooling jacket 19A. Heating from the inverter device for auxiliaries 43 is radiated by the cooling water in the coolant flow passage through an intermediate frame body of the housing 12. As described above, the cooling jacket 19A is disposed in the center of the housing 12, the metal base plate 11 is disposed on one side, that is, above the cooling jacket 19A, and the lower case 16 is disposed on another side, that is, below the cooling jacket 19A. With this configuration, parts necessary to constitute the power conversion apparatus 200 can be efficiently cooled according to the heating value. Also, since the parts are arranged inside of the power conversion apparatus 200 orderly, thereby enabling the apparatus to be downsized.

The radiator performing the heat radiating function of the power conversion apparatus is first the coolant flow passage 19, and also the metal base plate 11 performs that function. The metal base plate 11 performs the electromagnetic shield function, and also receives heat from the control circuit board 20 or the driver circuit board 22, conducts heat to the housing 12, and radiates heat by the cooling water in the coolant flow passage 19.

As described above, the power conversion apparatus according to this embodiment has a laminated body consisting of three layers being the radiators, that is, a laminated structure consisting of the metal base plate 11, the coolant flow passage 19 (cooling jacket 19A), and the lower case 16. Those radiators are hierarchically located adjacent to the respective heating bodies (the power modules 300, the control circuit board 20, the driver circuit board 22, and the capacitor module 500). The coolant flow passage 19 being a main radiator exists in the center of the hierarchical structure, and the metal base plate 11 and the lower case 16 are of a structure in which heat is transferred to the cooling water in the coolant flow passage 19 through the housing 12. Three radiators (the coolant flow passage 19, the metal base plate 11, and the lower case 16) are housed within the housing 12, thereby improving the radiation performance and contributing to the thinned and downsized apparatus.

Figures 10A, 10B:
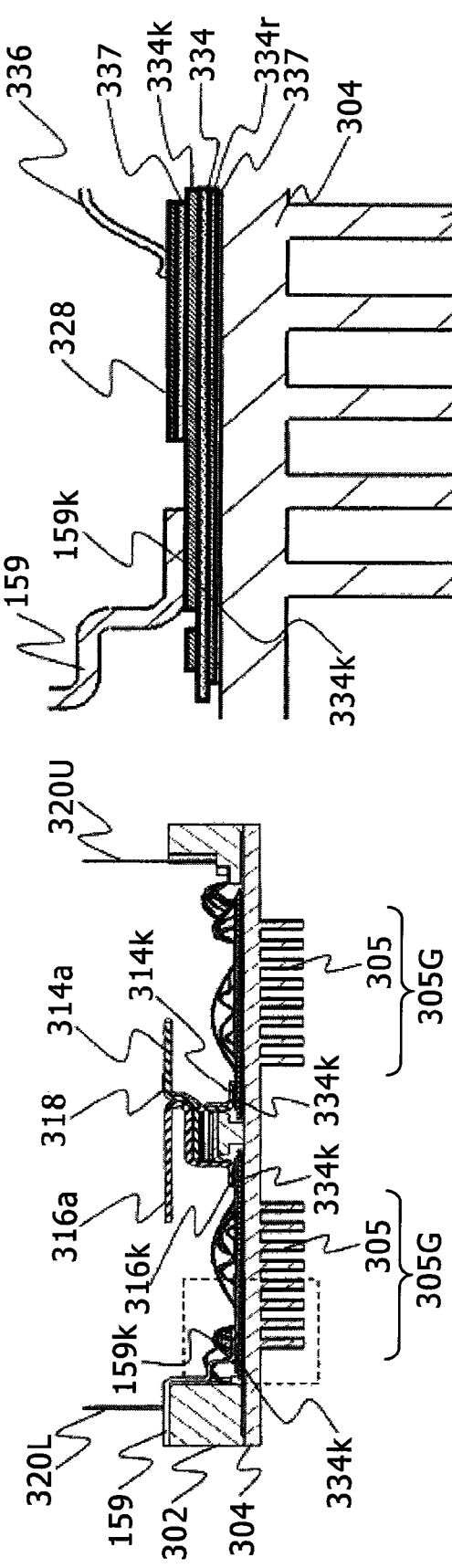
FIG. 10A is a cross-sectional view showing the structure of DC bus bar with a power module case being partially transparentized for facilitation of understanding the structure.
FIG. 10B is an enlarged diagram showing its main portion.

FIG. 8A is an upward perspective view showing the power module 300 according to this embodiment, and FIG. 8B is a top view showing the power module. FIGS. 9A and 9B are exploded perspective views showing the DC terminal of the power modules 300 according to this embodiment. FIGS. 10A and 10B are cross-sectional views showing a configuration in which a power module case 302 is partially transparentized for facilitation of understanding of the structure of the DC bus bar. FIG. 9A is a diagram showing a configuration in which the metal base 304 and one of three upper and lower arm series circuits being components of the power module 300 are extracted. FIG. 9B is an exploded perspective view showing the metal base 304, a circuit wiring pattern, and an insulating substrate 334.

Referring to FIG. 8A, reference numeral 302 denotes a power module case, 304 is a metal base, 304 is a metal base, 305 is fins (refer to FIGS. 10A and 10B), 314a is a DC positive terminal connection portion, 316a is a DC negative terminal connection portion, 318 is an insulating paper (refer to FIG. 9), 320U/320L are control terminals of the power module, 328 is an upper arm IGBT, 330 is a lower arm IGBT, 156/166 are diodes, 334 is an insulating substrate (refer to FIG. 10), 334k is a circuit wiring pattern above the insulating substrate 334 (refer to FIG. 10), 334r is a circuit wiring pattern below the insulating substrate 334 (refer to FIG. 10), and 337 is a solder that joins the circuit wiring pattern 334r to the metal base 304, respectively.

The power module 300 mainly includes a semiconductor module portion including wiring inside of the power module case 302 which is made of, for example, a resin material, a metal base 304 made of a metal material, for example, Cu, Al, or AlSiC, and a connection terminal (DC positive terminal 314, control terminal 320U, etc.) to the external. Then, as the terminals connected with the external, the power module 300 includes AC terminals 159 for U, V, and W-phase for connection to the motor, the DC positive terminal 314 and the DC negative terminal 316 (refer to FIG. 9) which are connected with the capacitor module 500.

In the semiconductor module portion, IGBTs 328, 330, and diodes 156/166, and the like for the upper and lower arms are disposed on the insulating substrate 334, and protected with a resin or silicon gel (not shown). The insulating substrate 334 may be a ceramic board, or a thinner insulating sheet.

FIG. 8B is a configuration diagram showing how the upper and lower arm series circuits are specifically arranged on the insulating substrate 334 made of ceramic excellent in thermal conductivity which is fixed to the metal base 304. The IGBTs 328, 330 and the diodes 327, 332 shown in FIG. 8B connect two chips in parallel, respectively, to form an upper arm and a lower arm, and the capacity of current supplied to the upper and lower arms is increased.

As shown in FIG. 9, the DC terminal 313 built into the power module 300 has a laminated structure of the DC negative terminal 316 and the DC positive terminal 314 via the insulating paper 318 interposed therebetween (a portion indicated by a dotted line in FIG. 9). The ends of the DC negative terminal 316 and the DC positive terminal 314 are bent in directions opposite to each other to form the negative connection portion 316a and the positive connection portion 314a for electrically connecting the laminated conductor plate 700 and the power module 300. The connection portions 314a and 316a with the laminated conductor plate 700 are disposed in two, respectively, whereby a mean distance from the negative electrode connection portion 316a and the positive 316a and the positive electrode connection portion 314a to the three upper and lower arm series circuits are substantially equal to each other. As a result, a variation in the parasitic inductance within the power module 300 can be reduced.

The DC positive terminal 314, the insulating paper 318, and the DC negative terminal 316 are laminated and assembled into a structure in which the negative connection portion 316a and the positive connection portion 314a are bent in directions opposite to each other. The insulating paper 318 is bent along the negative connection portion 316a to ensure the insulting creepage distance between the positive and negative terminals. The insulating paper 318 is used with a sheet made of the combination of polyimide or meta system aramid fiber and polyester high in tracking property when heat resistance is necessary. Also, two insulating papers 318 are stacked on each other when the reliability is enhanced taking a defect such as pin holes taking into consideration. Also, in order to prevent the insulating paper 318 from tearing or cracking, the corners are rounded, the slack surface at the time of punching is made in a direction facing the insulating paper so that the edge of each terminal comes out of the insulating paper. In this embodiment, the insulating paper is used as an insulator, but as another example, the terminals may be coated with insulator. In order to reduce the parasitic inductance, when the power module of, for example, withstand voltage 600 V is used, a distance between the positive electrode and the negative electrode is set to 0.5 mm or lower, and the thickness of the insulating paper is set to its half.

The DC positive terminal 314 and the DC negative terminal 316 have connection ends 314k and 316k for connection with a circuit wiring pattern 334k, respectively. The respective connection ends 314k and 316k are provided in two with respect to each phase (U, V, and W phases). As a result, as will be described later, those connection ends can be connected with the circuit wiring pattern having two small loop current paths formed for the arm of each phase. Also, the respective connection ends 314k and 316k project toward the direction of the circuit wiring pattern 334k, and in order to form a joint surface with the circuit wiring pattern 334k, their leading ends are bent. The connection ends 314k, 316k and the circuit wiring pattern 334k are connected to each other through soldering or the like, or metals are connected directly to each other by supersonic welding.

The power modules 300, more particularly, the metal base 304 is expanded or contracted by temperature cycle. The expansion and contraction causes a risk that the connection portions of the connection ends 314k, 316k and the circuit wiring pattern 334k are cracked or fractured. Under the circumstances, in the power module 300 according to this embodiment, as shown in FIG. 9, a laminated planar portion 319 formed by laminating the DC positive terminal 314 and the DC negative terminal 316 is configured to be substantially in parallel to the plane of the metal base 304 at a side where the insulating substrate 334 is mounted. As a result, the laminated plane portions 319 enable roll-back operation corresponding to the roll-back of the metal base 304 which occurs due to the above expansion and contraction. For that reason, the rigidity of the connection ends 314k and 316k integrated with the laminated plane portions 319 can be reduced with respect to the roll-back of the metal base 304. Accordingly, a stress applied to the joint surface of the connection ends 314k, 316k and the circuit wiring pattern 334k in the vertical direction can be eased up, and the crack or fracture of the joint surface can be prevented.

In order that the laminated plane portions 319 according to this embodiment enable the roll-back operation in correspondence with the roll-back of the metal base 304 in both of the width direction and the depth direction of the metal base 304, the width length of the laminated plane portions 319 is set to 130 mm, and the depth length thereof is set to 10 mm so that the width length is longer. Also, the thickness of the respective laminated plane portions 319 of the DC positive terminal 314 and the DC negative terminal 316 is set relatively thinly to be 1 mm so as to facilitate the roll-back operation.

As shown in FIGS. 10A and 10B, the metal base 304 has fins 305 on an opposite side of the insulating substrate 334 in order to efficiently radiate heat to the cooling water flowing in the coolant flow passage 19. The metal base 304 has an IGBT and a diode constituting the inverter circuit mounted on one surface thereof, and a power module case 302 made of resin disposed on the outer periphery of the metal base 304. The fins 305 are projected on another surface of the metal base 304 by brazing. Alternatively, the metal base 304 and the fins 305 may be integrated together by casing. This manufacturing method is capable of improving the productivity of the power module 300, improving the thermal conductivity of the metal base 304 to the fins 305, and improving the radiation performance of the IGBTs and the diodes. Also, when the metal base 304 is manufactured with a material 60 or higher in Vickers hardness, the ratchet deformation of the metal base 304 which is attributable to a temperature cycle is suppressed, thereby making it possible to improve the sealing property of the metal base 304 and the housing 12. Further, as shown in FIG. 10A, two sets of fin groups 305G are disposed in correspondence with the upper and lower arms, respectively, and those fin groups 305G project into the water passage from the openings 400 and 402 above the reciprocating coolant water passage 19. The metal surface around the fin groups 305G of the metal base 304 is used to close the openings 400 and 402 defined n the cooling jacket 19.

The configuration of the fins 305 according to this embodiment is of pin type, but as another configuration, may be of straight type formed along the flow direction of the cooling water. When the configuration of the fins 305 is of the straight type, a pressure for allowing the cooling water to flow can be reduced. On the other hand, when the pin type fins are used, the cooling efficiency can be improved.

Onto one surface of the metal base 304 is fixed the insulating substrate 334, and onto the insulating substrate 334 is fixed a chip having the upper-arm IGBT 328 and the upper-arm diode 156 as well as the lower-arm IGBT 330 and the lower-arm diode 166 by solder 337.

Figures 11A, 11B:
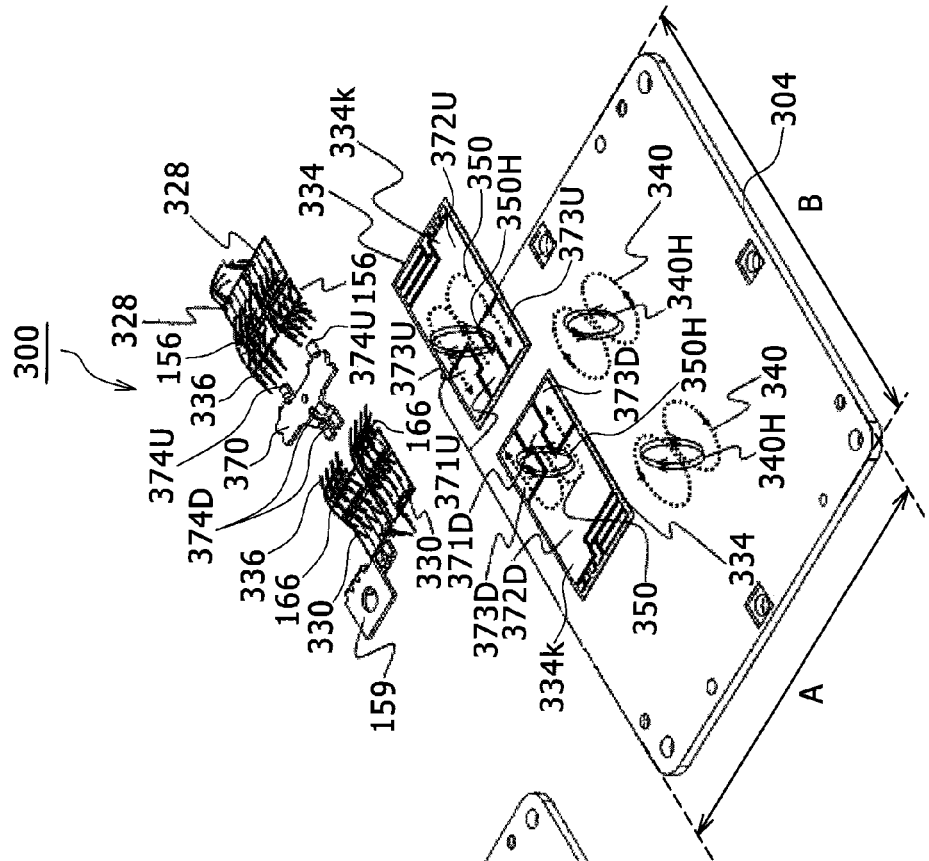
FIG. 11A is a diagram for explaining the upper and lower arm series circuit.
FIG. 11B is a diagram for explaining a current pathway of the power module.

As shown in FIG. 11A, the upper and lower arm series circuit 150 has an upper arm circuit 151, a lower arm circuit 152, a terminal 370 for connecting those upper and lower arm circuits 151 and 152, and an AC terminal 159 for outputting AC power. Also, as shown in FIG. 11B, the upper arm circuit 151 has the insulating substrate 334 formed with the circuit wiring pattern 334k, disposed on the metal base 304, and the IGBT 328 and the diode 156 mounted on the circuit wiring pattern 334k.

The IGBT 328 and the diode 156 have the electrodes on their rear surfaces and the circuit wiring pattern 334k joined together by soldering. The insulating substrate 334 has a surface (rear surface) opposite to the circuit wiring pattern surface, formed with no pattern, that is, a so-called solid pattern. The solid pattern on the rear surface of the insulating substrate 334 and the metal base 304 are joined together by soldering. Like the upper arm, the lower arm circuit 152 includes the insulating substrate 334 arranged on the metal base 304, the circuit wiring pattern 334k wired on the insulating substrate 334, the IGBT 330 mounted on the circuit wiring pattern 334k, and the diode 166.

The electrodes on the rear surface of the IGBT 330 and the diode 166 are also joined to the circuit wiring pattern 334k by soldering. Each arm of the respective phases in this embodiment is configured by connecting, in parallel, two sets of circuit portions each having the IGBT 328 and the diode 156 connected in parallel. The required number of sets of circuit portions is determined according to the amount of current supplied to the motor 192. When a larger current than the current supplied to the motor 192 according to this embodiment is necessary, three or more sets of circuit portions are configured to be connected in parallel. On the contrary, when the motor can be driven by a small current, each arm of the respective phases is configured by only one set of circuit portion.

A current path of the power modules 300 will be described with reference to FIG. 11B. A path of current flowing in the upper arm circuit 151 of the power module 300 will be described below.

The current flows in (1) a connection conductor portion 371U from the DC positive terminal 314 not shown, (2) an electrode at one side (an electrode at a side connected with the element side connection conductor portion 372U) of the upper-arm IGBT 328 and the upper arm diode 156 through the element side connector conductor portion 372U from the connection conductor portion 371U, (3) connection conductor portions 373U from an electrode at another side of the upper-arm IGBT 328 and the upper-arm diode 156 through the wire 336, and (4) a connection conductor portion 371D from the connection conductor portions 373U through connection portions 374U and 374D of the connection terminal, 370. As described above, the upper arm is configured by two sets of circuit portions each having the IGBT 328 and the diode 156 connected in parallel. Hence, in the above current path (2), the current is branched into two currents by the element side connection conductor portion 372U, and the branched currents flow into the two sets of circuit portions, respectively.

The current path flowing in the lower arm circuit 152 of the power module 300 will be described below.

The current flows in (1) an electrode at one side (an electrode at a side connected with an element side connect-ion conductor portion 372D) of the lower-arm IGBT 330 and the upper-arm diode 166 from the connection conductor portion 371D through the element side connection conductor portion 372D, (2) a connection conductor portions 373D from an electrode at another side of the lower-arm IGBT 330 and the lower-arm diode 166 through the wire 336, and (3) the DC negative terminal 316 not shown from the connection conductor portions 373D. Like the upper arm, the lower arm is configured by connecting two sets of circuit portions each having the IGBT 330 and the diode 166 connected in parallel. Therefore, in the above current path (1), the current is branched into two currents by the element side connection conductor portion 371D, and the branched currents flow into the two sets of circuit portions, respectively.

The connection conductor portion 371U for connecting the IGBT 328 (and the diode 156) of the upper arm circuit with the DC positive terminal 314 not shown is arranged substantially in the center of one side of the insulating substrate 334. Then, the IGBT 328 (and the diode 156) is mounted in the vicinity of another side opposite to one side of the insulating substrate 334 where the connection conductor portion 371U is arranged. Also, in this embodiment, the two connection conductor portions 373U sandwich the above connection conductor portion 371U, and are arranged on one side of the insulating substrate 334 in a line.

The above circuit pattern and mounted pattern, that is, the circuit wiring pattern on the insulating substrate 334 includes a substantially T-shaped wiring pattern, and two wiring patterns (371U) at both sides of a substantially T-shaped vertical bar (371U). The terminals are mounted from the connection ends 371U and 373U with the results that a transitional current path at the time of switching the IGBT 328 becomes an M-shaped current path as indicated by an arrow 350 (broken line) of FIG. 11B, that is, two small loop current paths (the direction indicated by the arrow when the lower arm turns off). A magnetic field 350H is developed in the periphery of the two small loop current paths in a direction (solid line) indicated by an arrow 350H of FIG. 11B. The magnetic field 350H allows an induced current, a so-called eddy current 340 to be induced on the metal base 304 arranged below the insulating substrate 334. The eddy current 340 generates a magnetic field 340H in a direction of canceling the above magnetic field 350H, thereby enabling the parasitic inductance occurring in the upper arm circuit to be reduced.

The above two small loop currents are such two U-turn currents that currents flowing on the insulating substrate 334 cancel each other. For that reason, as indicated by the magnetic field 350H in FIG. 11B, because the smaller loop magnetic field can be developed inside of the power module 300, the parasitic inductance can be reduced. Further, because the magnetic field loop produced at the time of switching is small, and the magnetic field loop can be shut inside of the power module, the induced current to the housing outside of the power module is reduced, thereby making it possible to prevent the malfunction of the circuit on the control circuit board, and the electromagnetic noises to the external of the power conversion apparatus.

The lower arm circuit includes the same circuit wiring pattern and mounted pattern as those of the above upper arm circuit. That is, the connection conductor portion 371D for connecting the IGBT 330 (and the diode 166) of the lower arm circuit and the DC negative terminal 316 not shown is arranged in the vicinity of the substantially center of one side of the insulating substrate 334. Then, the IGBT 330 (and the diode 166) is mounted in the vicinity of another side opposite to one side of the insulating substrate 334 where the connection conductor portion 371D is arranged. Also, in this embodiment, the two connection conductor portions 373D sandwich the above connection conductor portion 371D, and are arranged on one side of the insulating substrate 334 in a line.

With the above circuit wiring pattern and mounted pattern, likewise, on the lower arm circuit side is reduced the above parasitic inductance. In this embodiment, an inlet of the current path of each arm for each phase is, for example, the connection conductor portion 371U sandwiched between the two connection conductor portions 373U. On the other hand, the outlet of the current path is the two connection conductor portions 373U. However, even when the inlet and the outlet are reversed, the above small loop current path is formed in each arm for each phase. For that reason, like the above, it is possible to reduce the parasitic inductance of each arm for each phase, and prevent the electromagnetic noises.

A description will be given in more detail of a structure in which the power module 300 is fastened to the housing 12 with reference to FIGS. 12A and 12B.

Figure 12A:
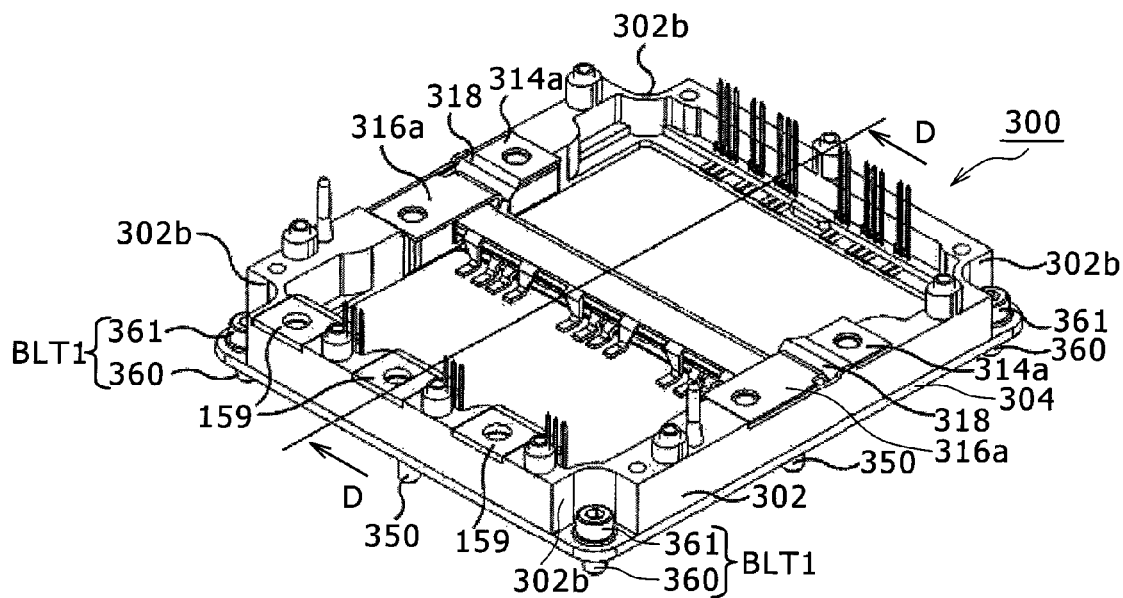
FIGS. 12A and 12B are diagrams showing the power module from which a semiconductor module portion is removed, FIG. 12A being a perspective view thereof and FIG. 12B being a cross-sectional view of FIG. 12A taken along a line D-D.
Figure 12B:
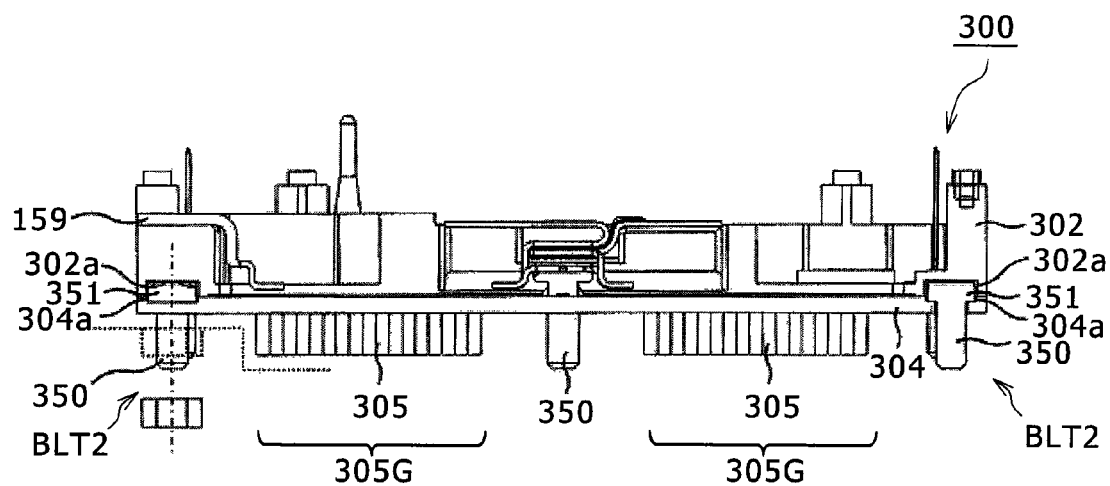

FIGS. 12A and 12B are diagrams showing the power module 300 from which the semiconductor module portion is removed, FIG. 12A being a perspective view thereof and FIG. 12B being a cross-sectional view of FIG. 12A taken along a line D-D.

The power conversion apparatus according to this embodiment includes the cooling jacket 19A having the coolant flow passage 19 formed therein, and the power modules 300. The cooling jacket 19A is integrated with the housing 12. The power modules 300 each have the metal base 304. On the front surface of the metal base 304 is mounted the semiconductor device 140 having the inverter circuit 144 that executes power conversion between the DC power and the AC power, and on the rear surface thereof is projected the radiation fins 305 projecting into the coolant flow passage 19. The cooling jacket 19A has the openings 400 and 402 of the coolant flow passage 19 formed. The power modules 300 are fixed to the cooling jacket 19A, that is, the housing 12 by a front surface side fastening device BLT1 and a rear surface side fastening device BLT2 so as to close the openings 400 and 402. The openings 400 and 402 are closed by the metal base 304 to form the coolant flow passage 19. The front surface side fastening device BLT1 fastens the power modules 300 to the cooling jacket 19A from its surface. The rear surface side fastening device BLT2 fastens the power modules 300 to the housing 12 from the rear surface of the cooling jacket 19A. On the front surface area of the power modules 300 facing the rear surface side fastening device BLT2, that is, the top surface area of the case member 302 are arranged diverse components of the power modules 300, in this embodiment, the AC terminal 159, the DC positive terminal connection portion 314a, and the DC negative terminal connection portion 316a.

The fastening of the power modules by the front surface side fastening device BLT1 will be described. The front surface side fastening device BLT1 includes bolts 360 and the bolt holes 412, 414. As described above, the power modules 300 are fixed to the cooling jacket 19A, that is, the housing 12 by using the bolt holes 412 and 414 (refer to FIG. 5B) defined in the power module mounting surface 410S of the housing 12. The bolt holes are threaded screw holes. As shown in FIG. 12A, notches 302b are provided to four corners of the power module case 302, and the bolt through-holes 304b defined at the four corners of the metal base 304 are exposed. The power modules 300 are mounted on the mounting surface 410S of the housing 12, the bolts 360 are screwed into the bolt holes 412 (414) of the mounting surface 410S through the bolt through-holes 304b of the metal base 304 from the upper opening side of the housing 12 by using a tool, and the power modules 300 are fastened to the mounting surface 410S. The notches 302b at the four corners of the power module case 302 are configurations necessary to rotating the bolt heads 361 by the tool.

Figure 13:
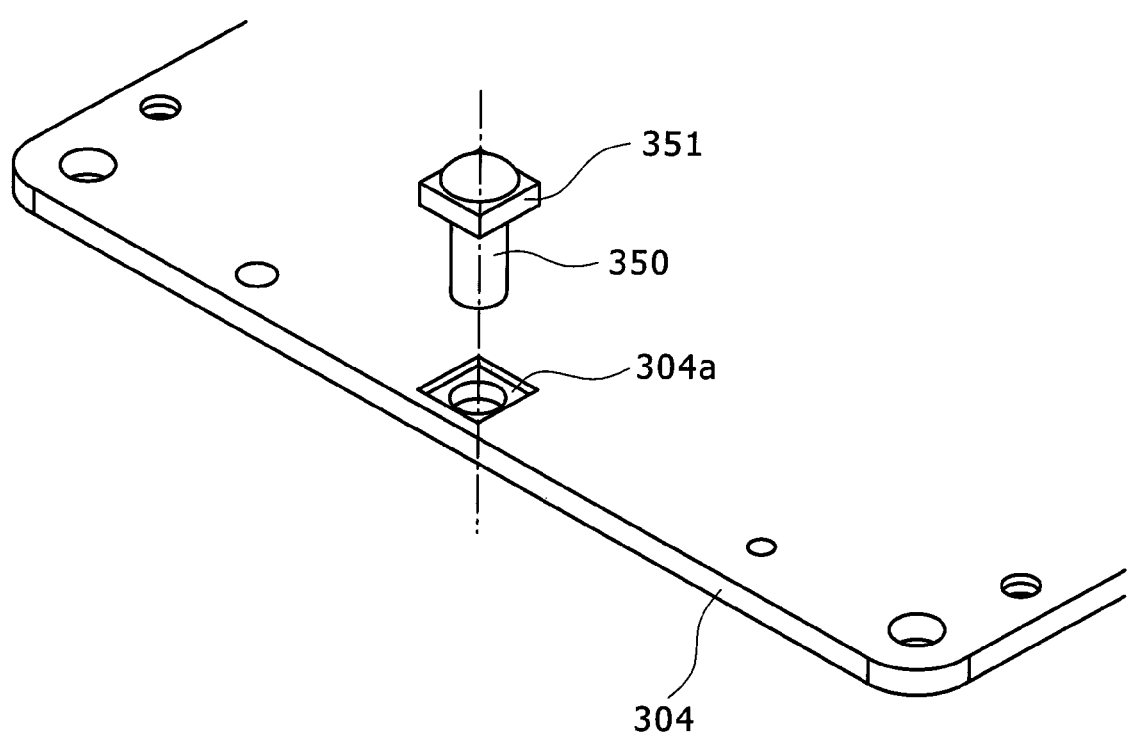
FIG. 13 is a diagram for explaining a recess of the metal base into which a bolt head of a bolt is fitted.

Fastening of the power modules by the rear surface side fastening device BLT2 will be described. The rear surface side fastening device BLT2 includes bolts 350 and nuts not shown. As shown in FIG. 12A, the power modules 300 are projected the bolts 350 from the rear surface of the metal base 304. The bolts 350 pass through the bolt through-holes 412A and 414A defined in the mounting surface 410S around the openings 400 and 402. As shown in FIGS. 11, 12B, and 13, the metal base 304 is provided with engagement recesses 304a that is engaged with the bolt heads 351 of the bolts 350. Also, as shown in FIG. 12B, the power module case 302 is provided with rectangular engagement recesses 302a that are engaged with the bolt heads 351 of the bolts 350. After the power module case 302 has been joined to the metal base 304, the bolt heads 351 are received in the recesses 302a inside of the power module case 302. The heads 351 of the bolts 350 are rectangular, and the bolt heads 351 are engaged with the rectangular recesses 302a defined in the power module case 302, and the rectangular recesses 304a defined in the metal base 304. This engagement structure is a turn stop mechanism of the bolts 350. After the bolts 350 are allowed to pass through the bolt through-holes 412A and 414A, nuts not shown are screwed with the bolts 350 from the bottom surface side of the housing 12 (cooling jacket 19A) to fasten the metal base 304 to the housing 12. The recesses 302a of the power module case 302 prevent from the bolts 350 from being escaped upward.

As described above, the power modules 300 are fixed to the housing 12 by fastening the bolts 360 from above of the housing 12, and then the top and bottom of the housing 12 are reversed, and the power modules 300 are fixed to the housing 12 by screwing the bolts 350 projecting from the rear surface side of the cooling jacket 19A to the nuts. With application of the above fastening structure, as shown in FIG. 12B, the AC terminals 159 for the U, V, and W phases for connection with the motor can be located above the bolt heads 351 for fastening the power modules, that is, on the top surface (peripheral edge of the metal base 304) of the power module case 2, thereby enabling the power modules 300 to be downsized.

Figure 14:
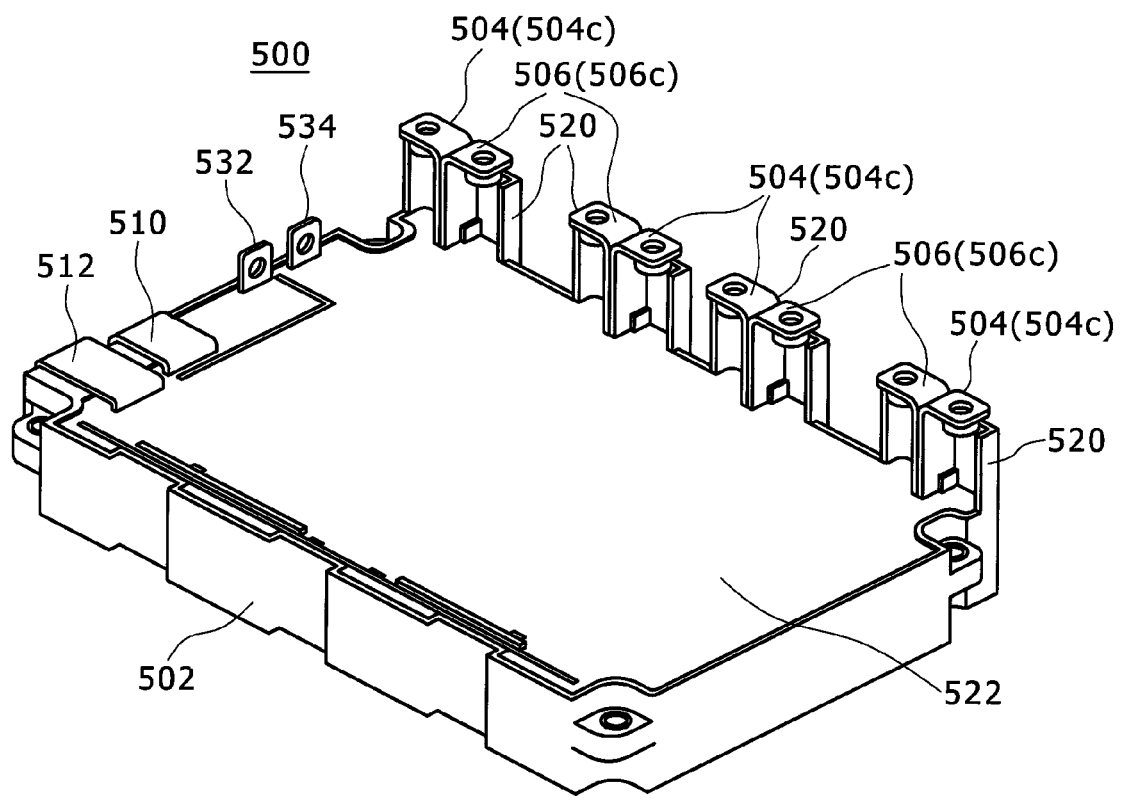
FIG. 14 is a perspective view showing an external configuration of a capacitor module.
Figure 15:
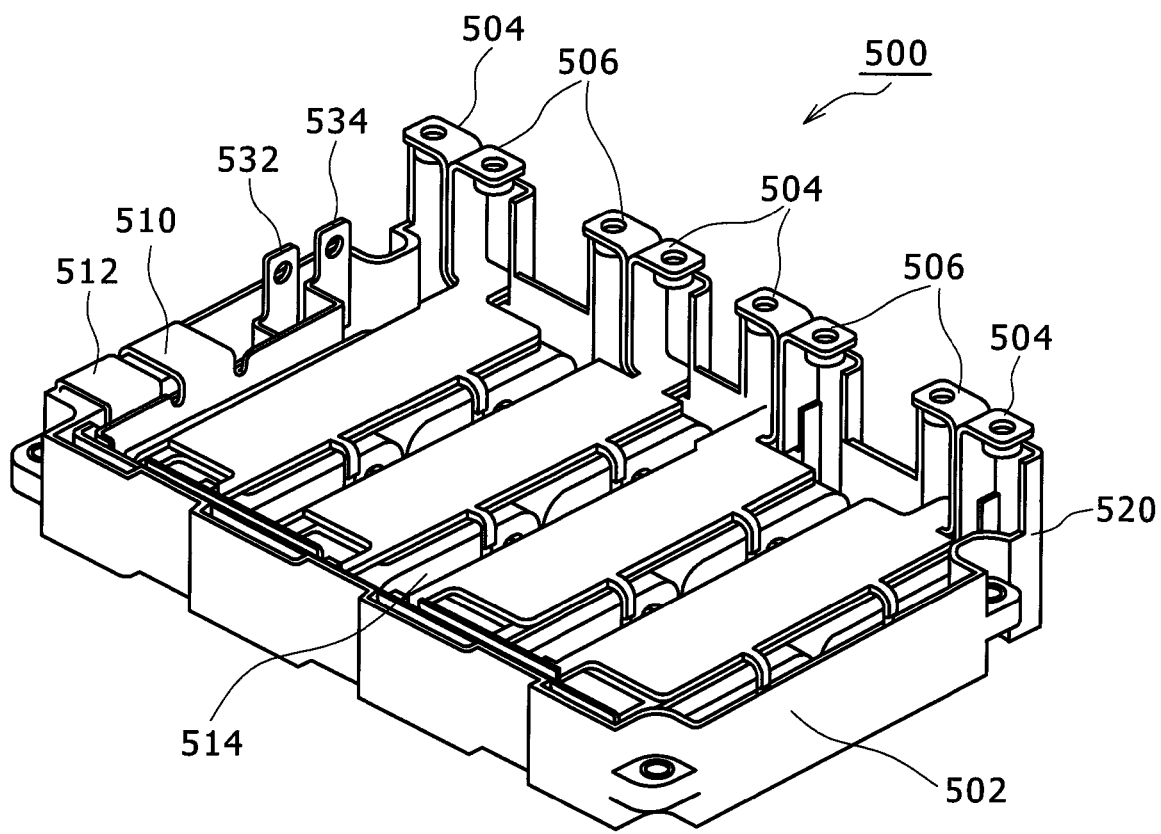
FIG. 15 is a perspective view showing a state of the capacitor module before the module is filled with a filler such as resin.
Figure 16:
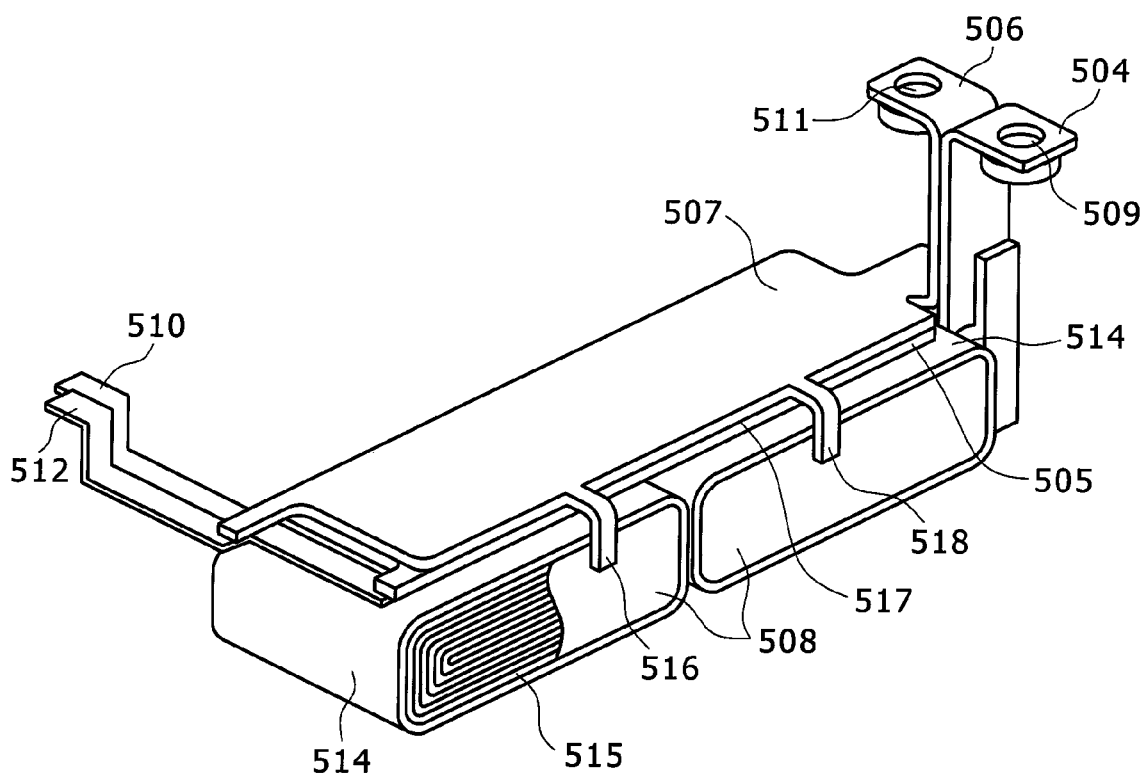
FIG. 16 is a diagram for explaining the configuration of a capacitor cell.

The detailed structure of the capacitor module 500 according to this embodiment will be described below with reference to FIGS. 14 to 16. FIG. 14 is a perspective view showing an external configuration of the capacitor module according to this embodiment. FIG. 15 is a perspective view showing a state of the capacitor module 500 before the module is filled with a filler 522 such as resin so that the interior of the capacitor module 500 shown in FIG. 14 is viewable. FIG. 16 is a diagram showing a structure in which the capacitor cells 514 are fixed to the laminated conductor body being the detailed structure of the capacitor module 500.

Referring to FIGS. 14 to 19, reference numeral 500 denotes the capacitor module, 502 is the capacitor case, 504 is the negative electrode side capacitor terminal, 506 is the positive electrode side capacitor terminal, 510 is the DC (battery) negative electrode side connection terminal portion, 512 is the DC (battery) positive electrode side connection terminal portion, 523 is the positive terminal for auxiliaries, 534 is the negative terminal for auxiliaries, and 514 is capacitor cells, respectively.

As shown in FIGS. 14 and 16, plural sets of laminated conductor plates each consisting of the negative conductor plate 505 and the positive conductor plate 507, four sets in this embodiment are electrically connected in parallel to the DC (battery) negative electrode side connection terminal portion 510 and the DC (battery) positive electrode side connection terminal portion 512. A plurality of terminals 516 and a plurality of terminals 518 for connecting to the positive electrodes and negative electrodes of the plurality of capacitor cells 514 in parallel, respectively, are disposed on the negative electrode conductor plate 505 and the positive electrode conductor plate 507.

As shown in FIG. 16, the capacitor cells 514 being a unit structure of a storage portion in the capacitor module 500 are each structured by a film capacitor 515 in which two films each having one surface deposited by a metal such as aluminum are laminated on each other and winded, and the respective two metal films are a positive electrode and a negative electrode. The positive electrode and the negative electrode are manufactured by spraying the conductor body 508 made of tin or the like onto the winded axial faces being the positive and negative electrodes, respectively.

Also, as shown in FIG. 16, the negative electrode conductor plate 505 and the positive electrode conductor plate 507 are each formed of a sheeted wide conductor, and are laminated on each other through the insulating paper 517 as a laminated structure, to thereby reduce the parasitic inductance. The terminals 516 and 518 for connection to the electrodes 508 of the capacitor cells are disposed on the ends of the laminated conductor. The terminals 516 and 518 are electrically connected to the electrodes 508 of the two capacitor cells 514 by soldering or welding. The capacitor cells are arranged so that soldering operation using a soldering device or welding operation using a welding machine is readily conducted, or the capacitor cells are readily examined, that is, the electrode surfaces connected to the terminals 516 and 518 are outside of the cells. Also, the structure of the conductor plate is designed to constitute one capacitor cell group. With the use of the above capacitor cell group, the number of capacitor cell groups is changed, thereby being capable of adapting the required capacity. As a result, the common capacitor cell can be used for wide variety of capacitor modules, and the capacitor module suitable for mass production can be provided. In order to reduce the parasitic inductance, also for the purpose of radiation, it is preferable to pluralize the terminals 516 and 518, respectively.

One end of the negative electrode conductor plate 505 and the positive electrode conductor plate 507 being the sheeted wide conductors is equipped with the negative electrode side capacitor terminal 504 and the positive electrode side capacitor terminal 506 for connection to the laminate conductor plate 700. Another end of the negative electrode conductor plate 505 and the positive electrode conductor plate 507 is equipped with the DC negative electrode side connection terminal 510 and the DC positive electrode side connection terminal 512 for connection to a terminal that receives the battery power.

The capacitor module 500 shown in FIG. 15 is made up of eight capacitor cells 514 in total in which four capacitor cell groups each having two capacitor cells as one unit are arranged tandem. As the connection terminals of the capacitor module 500 with the external, there are used four pairs of the positive and negative capacitor terminals 504 and 506, the DC positive and negative electrode side connection terminals 510 and 512 that receive the battery power, and the positive and negative terminals for auxiliaries 532 and 534 that supply power to the power module of the inverter for auxiliaries. The positive and negative capacitor terminals 504 and 506 are formed with openings 509 and 511, respectively. Nuts are welded on the rear sides of the openings 509 and 511 so that the DC positive and negative terminals 316 and 314 of the power module 300 can be fixed with the bolts.

The capacitor case 502 is equipped with the terminal cover 520, which positions the terminals, and insulates from the housing of the power conversion apparatus. Also, the capacitor case 502 has partitions for positioning the cell groups disposed between the adjacent cell groups. The capacitor case 502 is made of a material excellent in the thermal conductivity, and the partitions between the adjacent capacitor cell groups may be embedded with a material excellent in thermal conductivity for radiation.

In the capacitor module 500, when a ripple current flows at the time of switching due to the electric resistance of a metal thin film deposited on a film and the internal conductors (terminals) inside of the capacitor cell, heat is generated. For the moisture resistance of the capacitor cells, the capacitor cells and the internal conductors (terminals) are molded with the capacitor case 502 by a resin. For that reason, the capacitor cells and the internal conductors come in close contact with the capacitor case 502 through the resin, and are structured so that the heating of the capacitor cells is liable to be transferred to the case. Further, in this structure, the negative electrode conductor plate 505, the positive electrode conductor plate 507, the capacitor cells 508, and the terminals 516, 518 are connected directly to each other. Therefore, heat of the capacitor cells is transferred directly to the negative and positive conductors, and the heat is liable to be transferred to the mold resin by means of the wide conductor. For that reason, as shown in FIG. 7, heat is excellently transferred from the capacitor case 502 to the lower case 16, from the lower case 16 to the housing 12, and further to the coolant flow passage 19, thereby enabling radiation performance to be ensured.

As shown in FIG. 15, in this embodiment, the four laminated structures each having the negative electrode conductor plate 505 and the positive electrode conductor plate 507 are arranged tandem, independently, to constitute the capacitor module. All of the capacitor cells 514 may be connected to the wide conductor plate. With this configuration, the number of parts to be used can be reduced, the productivity can be improved, the electrostatic capacities of all the capacitor cells 514 can be made substantially uniform, and the lifetime of the parts of the entire capacitor module 500 can be extended. Further, the use of the wide conductor plate enables the parasitic inductance to be reduced.

FIG. 17A is a perspective view showing the power conversion apparatus 200 according to this embodiment, from which only the capacitor module 500, the laminated conductor plate 700, and the two power modules 300 are removed. FIG. 17B is an exploded perspective view of the DC side conductor plate 700.

As shown in FIG. 17A, the two power modules 300 allows the respective AC terminals 159 to be aligned at one side and disposed in parallel. The electric connection portion of the two power modules 300 and the capacitor module 500 are disposed at an opposite side of those AC terminals 159. The electric connection between the two power modules 300 and the capacitor module 500 is performed by the tabular laminated conductor plate 700.

A large number of capacitor cells 514 (not shown) are housed in the capacitor case 502 fixed onto the lower case 16, and the positive electrode side capacitor terminals 504 and the negative electrode side capacitor terminals 506 are arranged along one long side of the capacitor case 502. The positive electrode connection portions 504c and the negative electrode connection portions 506b being the upper ends of the positive electrode side capacitor terminals 504 and the negative electrode side capacitor terminals 506 are arranged at positions projected from the top surface of the capacitor cells 514.

The laminated conductor plate 700 connected with the power modules 300 are so arranged as to cover the two power modules 300. The positive electrode side capacitor terminals 504 and the negative electrode side capacitor terminals 506 are of an L-shaped structure in which those terminals stand from the opening surface of the capacitor case 502. The positive electrode connection portions 506b and the negative electrode connection portions 504c being the upper ends of the positive electrode side capacitor terminals 504 and the negative electrode side capacitor terminals 506 with the L-shaped structure are abutted directly against the laminated conductor plate 700 and connected by bolts at the time of assembling the power conversion apparatus 200.

As shown in FIG. 17B, the laminated conductor plate 70 is made up of the tabular positive electrode side conductor plate 702, the negative electrode side conductor plate 704, and an insulating sheet 706 sandwiched between the tabular positive electrode side conductor plate 702 and the negative electrode side conductor plate 704. That is, since the laminated conductor plate 700 is formed as the laminated structure, it is possible to reduce the parasitic inductance from the power modules 300 to the capacitor module 500.

As shown in FIGS. 17A and 8B, the plurality of upper arm control terminals 320U are arranged in the vicinity of the center of the A side (refer to FIG. 8B) of the power modules 300. That is, the U-phase control pin comes near the V-phase control pin, the W-phase control pin comes near the V-phase control pin, and the upper arm control terminals 320U are arranged in the vicinity of the center of the A side of the power modules 300 in a line. Then, the laminated conductor plate 700 has through-holes 705 allowing the plurality of upper arm control terminals 320U to pass therethrough, and on both sides of the through-holes 705 are also laminated the positive electrode side conductor plate 702 and the negative electrode side conductor plate 704. With the above configuration, the laminated area of the negative electrode side conductor plate 704 and the tabular positive electrode side conductor plate 702 can be expanded, and the parasitic inductance from the power modules 300 to the capacitor module 500 can be reduced.

A boss 321 is arranged in the vicinity of the center of the A side of the power module 300 shown in FIG. 8B, that is, in the vicinity of the upper arm control terminal 320U. To the boss 321 is fixed the driver circuit board 22 having the driver circuit 174 mounted, and the upper arm control terminal 320U is allowed to pass through the hole defined in the driver circuit board 22. Thereafter, the terminal on the driver circuit board 22 and the arm control terminal 320U are joined together by welding or the like. With the above configuration, since the joint portion of the upper arm control terminal 320U and the terminal on the driver circuit board 22 gets close to the boss 321, the vibration resistance at the time of traveling the vehicle is improved.

The driver circuit board 22 is arranged above the laminated conductor plate 700. With the above configuration, as shown in FIG. 17B, the laminated conductor plate 700 has the negative electrode side conductor plate 704 at the driver circuit board 22 side, and also has the positive electrode side conductor plate 702 at the power module 300 side. As a result, the negative electrode conductor plate 704 low in voltage and the insulating sheet 706 exist between the positive electrode conductor plate 702 high in voltage and the driver circuit board 22, and the driver circuit board 22 can be prevented from touching high voltage.

As shown in FIG. 17B, the positive electrode side conductor plate 702 is arranged to straddle the above of the two power modules 300, and also connects the two power modules 300 with the capacitor module 500. Likewise, the negative electrode conductor plate 702 is arranged to straddle the above of the two power modules 300, and also connects the two power modules 300 with the capacitor module 500. As a result, since the laminated conductor plate 700 is widened, the parasitic inductance from the power modules 300 to the capacitor module 500 can be reduced. Also, since there are four sets of connection portions of the capacitor module 500 with respect to one power module, the parasitic inductance can be reduced. Also, the connection conductor from the two power modules 300 to the capacitor module 500 is shared by two power modules 300, thereby making it possible to reduce the number of parts of the entire power conversion apparatus 200, and to improve the productivity.

As shown in FIG. 8, the power module 300 has one set of connection portions 314a and 316a arranged at one side of the power module 300 with the positive electrode side connection portion 314a and the negative electrode side connection portion 316a as one set. The power module 300 also has another set of connection portions 314a and 316a arranged at an opposite side thereof. The laminated conductor plate 700 is arranged to straddle above of those two sets of connection portions 314a and 316a, and is also connected by the respective connection portions 314a, 316a, and bolts. As a result, the DC current supplied from the capacitor module 500 does not concentrate on one set of connection portions 314a and 316a side, that is, the DC current is dispersed to two sets of connection portions 314a and 316a. Therefore, the inductance from the power modules 300 to the capacitor module 500 can be reduced.

As described above, into the capacitor module 500 are incorporated the plurality of capacitor cells 514. In this embodiment, two capacitor cells 514 constitute the capacitor cell groups, and four sets of capacitor cell groups are provided. Further, the wide conductor (the positive conductor plate 507 and the negative conductor plate 505) corresponding to each set is provided. As shown in FIG. 15, the positive electrode side capacitor terminals 504 and the negative electrode side capacitor terminals 506 are connected to the respective wide conductors one by one. In this embodiment, all of the positive capacitor terminals 504 and the negative electrode capacitor terminals 506 are electrically connected to one set of laminated conductor plate 700. As a result, all of the capacitor cells 514 are electrically connected to the two power modules 300, the electrostatic capacities of all the capacitor cells 514 can be made substantially uniform, and the lifetime of the parts of the entire capacitor module 500 can be extended. Further, the use of one set of laminated conductor plates 700 enables the interior of the capacitor module 500 to be divided for each of the capacitor cell groups each having two capacitor cells 514, and the unit number of the capacitor cells 514 constituting the capacitor cell groups can be easily changed in correspondence with the current capacity of the motor 192.

It is desirable that the positive electrode side conductor plate 702 and the negative electrode side conductor plate 704 constituting the laminated conductor plate 700 has a gap distance therebetween made as small as possible. For example, when a bent structure portion for connecting the power modules 300 and the capacitor module 500 exists, the gap distance larger than the plate portion occurs in the bent structure portion, and the parasitic inductance becomes large.

Under the circumstances, according to this embodiment, the positive electrode side connection portion 314a and the negative electrode side connection portion 316a of the power modules 300, and the positive electrode side connection portion 504c and the negative electrode side connection portion 506b of the capacitor module 500 are arranged substantially flush with each other. As a result, because the tabular laminated conductor plate 700 can be used, the gap distance between the positive electrode side conductor plate 702 and the negative electrode side conductor plate 704 is made short to enable the parasitic inductance to be reduced.

FIG. 18A is an enlarged diagram showing a connection portion 380 (refer to FIG. 17A) of the power module 300 and the laminated conductor plate 700 shown in FIGS. 17A and 17B.

As shown in FIG. 18A, the negative electrode side connection portion 316a and the positive electrode side connection portion 314a are configured by bending the ends of the DC positive terminal 314 and the DC negative terminal 316 in opposite directions. The negative conductor plate 704 and the positive conductor plate 702 of the laminated conductor plate 700 are connected to the negative electrode side connection portion 316a and the positive electrode side connection portion 314a, respectively. With the above configuration, because a current at the negative electrode side which instantaneously flows at the time of switching the IGBTs 328 and 330 passes through a current path 382 shown in FIG. 18A, a U-turn current is formed between the connection portion 704a of the negative electrode conductor plate and the negative electrode side connection portion 316a. Accordingly, the inductance can be reduced since a magnetic flux developed around the connection portion 704a of the negative electrode side conductor plate 704 and a magnetic flux developed around the negative electrode side connection portion 316a cancel each other.

On the other hand, a current at the connection portion 702a of the positive conductor plate passes through a current path 384 shown in FIG. 18A. Because the negative electrode conductor plate 704 is arranged above the connection portion 702a of the positive electrode conductor plate, a current direction of the connection portion 702a of the positive electrode conductor plate and a current direction of the negative electrode conductor plate 704 are opposite to each other, and the magnetic fluxes developed by the respective currents cancel each other. As a result, the parasitic inductance at the connection portion 702a of the positive electrode conductor plate can be reduced.

Also, as shown in FIG. 18A, the insulating paper 318 and the insulating sheet 706 are arranged to provide an area in which those components overlap with each other vertically, respectively. Further, when the laminated conductor plate 700 is fixed to the negative electrode side connection portion 316a and the positive electrode side connection portion 314a by bolts or the like, the insulating paper 318 and the insulating sheet 706 are so arranged as to provide an area in which those components are not sandwiched between the laminated conductor plate 700 and the positive electrode side connection portion 314a, that is, an area in which no compression stress is applied to those components. As a result, insulation between the positive electrode and the negative electrode at the connection portion, specifically, the insulation between the positive electrode side connection portion 314a and the negative electrode conductor plate 704 can be ensured.

FIG. 18B shows an enlarged diagram (refer to FIG. 17A) of a connection portion 390 of the laminated conductor plate 700. As shown in FIG. 18B, the positive electrode side connection portion 506b and the negative electrode side connection portion 504c of the capacitor module 500 are configured by bending in opposite directions, respectively. To the respective top surfaces are connected the positive electrode conductor plate 702 and the negative electrode conductor plate 704 of the laminated conductor plate 700, respectively. As a result, because a current at the negative electrode side which instantaneously flows at the time of switching the IGBTs 328 and 330 passes through a current path 392 shown in FIG. 18B, a U-turn current is formed between the connection portion 704c of the negative electrode conductor plate 704 and the negative electrode side connection portion 504c of the capacitor module 500. Accordingly, the inductance can be reduced since a magnetic flux developed around the connection portion 704a of the negative electrode side conductor plate 704 and a magnetic flux developed around the negative electrode side connection portion 504c cancel each other.

Likewise, a current at the positive electrode side which instantaneously flows at the time of switching the IGBTs 328 and 330 passes through a current path 394 shown in FIG. 16B. That is, a U-turn current is formed between the connection portion 702b of the positive electrode conductor plate and the positive electrode side connection portion 506b of the capacitor module 500. Accordingly, the inductance can be reduced since a magnetic flux developed around the connection portion 702b of the positive electrode side conductor plate 702 and a magnetic flux developed around the positive electrode side connection portion 506b cancel each other.

Also, as shown in FIG. 18B, the insulating sheet 517 and the insulating sheet 706 are arranged to provide an area in which those components overlap with each other vertically, respectively. Further, when the laminated conductor plate 700 is fixed to the positive electrode side connection portion 506b and the negative electrode side connection portion 504c by bolts or the like, the insulating sheet 517 and the insulating sheet 706 are so arranged as to provide an area in which those components are not sandwiched between the laminated conductor plate 700 and the positive electrode side connection portion 506b, that is, an area in which no compression stress is applied to those components. With the above configuration, insulation between the positive electrode and the negative electrode at the connection portion, specifically, the insulation between the positive electrode side connection portion 506*b* and the negative electrode conductor plate 704 can be ensured.

According to the embodiment described above, the following advantageous effects are obtained.

(1) The front surface side fastening device BLT1 allows the power module 300 to be fastened to the cooling jacket 19A from a front surface thereof. Thereafter, the top and bottom of the housing 12 are reversed, and the power modules 300 are fixed to the housing 12 by screwing the bolts 350 projecting from the rear surface side of the cooling jacket 19A to the nuts. On the front surface of the power modules 300 facing the rear surface side fastening device BLT2, that is, on the top surface of the case member 302 are arranged diverse components of the power module 300, in this embodiment, the AC terminal 159, the DC positive electrode terminal connection portion 314*a*, and the DC negative terminal connection portion 316*a*. Accordingly, the power module 300 can be downsized.

(2) The front surface side fastening device BLT1 allows the power module 300 to be fastened from above of the housing 12. Thereafter, the top and bottom of the housing 12 are reversed, and the power modules 300 are fixed to the housing 12 by the rear surface side fastening device BLT2 from beneath of the housing 12. Accordingly, even if the power module is downsized, the assembling property of the power conversion apparatus is not adversely affected.

(3) The power module 300 has the inverter device 140 mounted on the top surface, and includes the metal base 304 (base plate) having the radiation fins 305 projecting from the rear surface into the coolant flow passage 19. The front surface side fastening device BLT1 fixes the metal base 304 to the housing 12 from the front surface side at four corners of the metal base 304. The rear surface side fastening device BLT2 fixes the metal base 304 to the housing 12 from the rear surface side at the intermediate points of the peripheral edge of the metal base 304. Thus, the metal base plate 304 is fastened at not only the four corners but also the intermediate points of the peripheral edge. For that reason, the fastening force of the peripheral edge of the metal base 304 can be sufficiently increased, and there is no risk that the metal base 304 is deformed by hydraulic pressure within the coolant flow passage.

In order to efficiently cool the power modules 300, the hydraulic pressure within the coolant flow passage 19 may be set to a given high pressure. For that reason, when water tightness cannot be sufficiently obtained by fastening the four corners of the metal base 304 of the power module 300 by bolts, it is necessary to fix the intermediate points of the peripheral edge of the metal base 304 by bolts. As with the fastening the four corners of the metal base, when there is applied a system of fastening the intermediate points from above of the power modules by bolts, diverse components of the power modules cannot be arranged in the peripheral edge of the metal base, and the power modules are upsized. Also, even when the power modules are upsized because of the required power capacity, even if the pressure within the coolant flow passage is low, there is a need to fasten the intermediate points in the peripheral edge of the metal base by bolts to improve the water tightness. Similarly, in this case, when there is applied a structure in which the power modules 300 are fastened from beneath of the housing 12 as in the present invention, the power modules 300 can be downsized.

(4) It is possible to fasten the four corners of the metal base 304 by the same bolts and nuts as those of the peripheral edge intermediate points. However, in a state where the power module 300 is merely positioned to the mounting surface of the cooling jacket 19A, that is, in a state where the power modules are not fastened, the top and bottom of the housing 12 is reversed, and the fastening operation is executed from the rear surface of the cooling jacket 19A. This leads to a risk that the power modules 300 fall down. Accordingly, the nuts need to be screwed from beneath of the housing without reversing the top and bottom of the housing 12, and the workability is low. As compared with the above power module fitting system, the assembling workability of the power module fixing system according to the above embodiment is remarkably excellent.

(5) The configuration of the bolt heads 351 of the bolts 350 is rectangular, and the bolts 350 are engaged with the recesses 302*a* of the power module case 302 and the recesses 304*a* of the metal base 304. Accordingly, the rotation preventing mechanism and the retainer of the bolts 350 can be simply structured.

The above embodiment can be modified as follows.

(1) In the above embodiment, the recesses 302 and 304*a* engaged with the bolt heads in order to prevent the rotation of the bolts 350 are provided in the power module case 302 and the metal base 304, but may be provided in any one.

Figure 19:
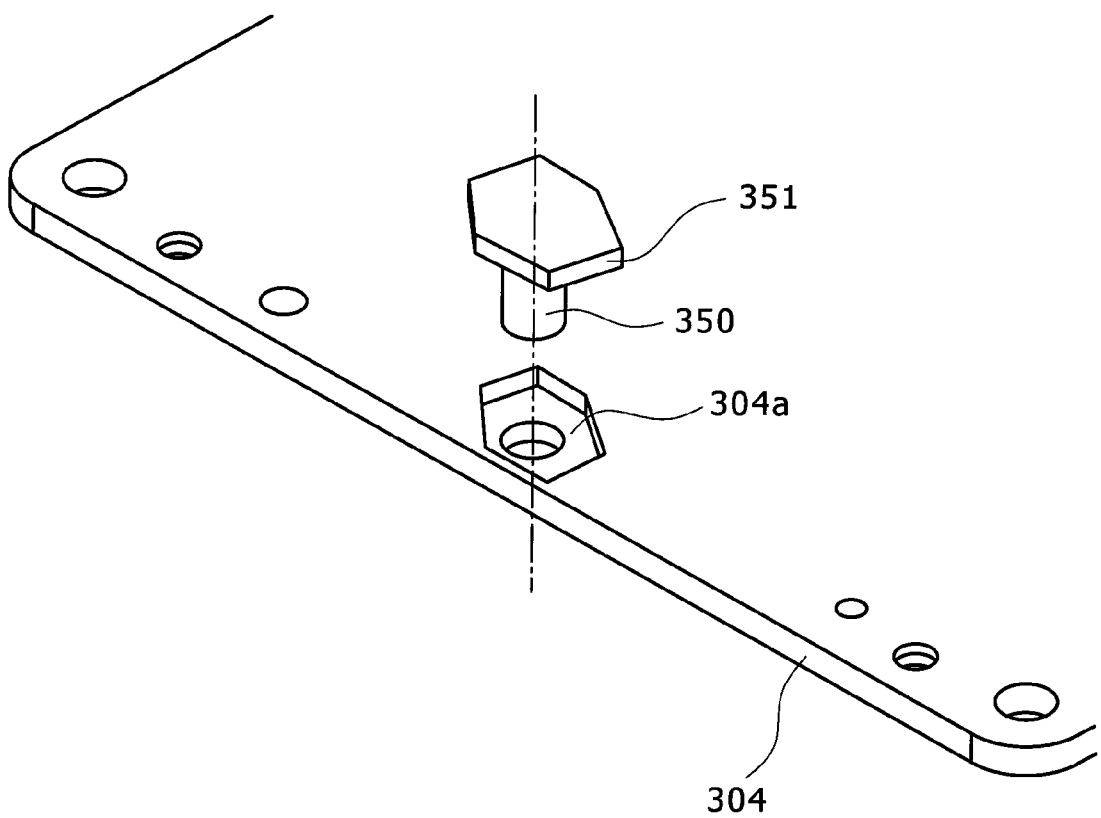
FIG. 19 is a diagram for explaining a modified example of the bolt head of the bolt for fixing the power module to the cooling jacket.

(2) When the rotation of the bolts 350 when rotating the nuts can be prevented, the configuration of the bolt heads 351 is not limited to rectangle. For example, as shown in FIG. 19, the bolt heads 351 of the bolts 350 may be hexagonal. In this case, the configuration of the recesses 304*a* of the metal base 304 which are fitted to the bolt heads 351 is also hexagonal.

Figure 20A:
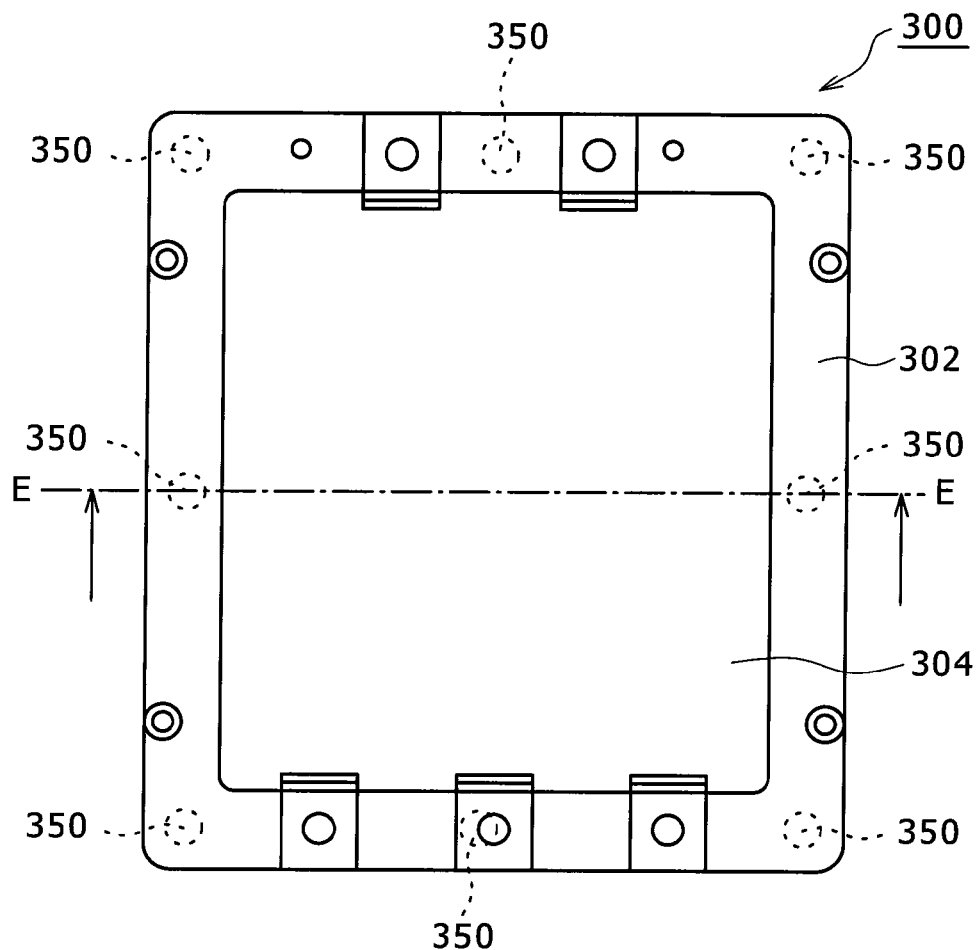
FIGS. 20A and 20B are diagrams for explaining a modified example of a fixing method for fixing the power module to the cooling jacket, FIG. 20A being a plan view of the power module, and FIG. 20B being a cross-sectional view of FIG. 20A taken along a line E-E.
Figure 20B:
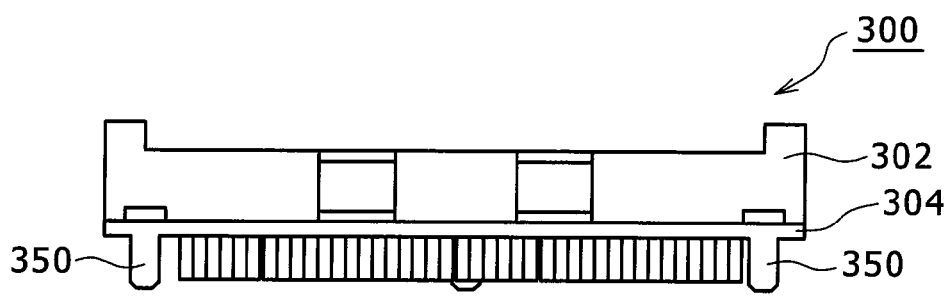

(3) When the rotation of the bolts 350 due to the rotating operation of the nuts can be prevented, the rotation preventing mechanism is not limited to provision of the recesses engaged with the bolt heads 351 to at least one of the power module case 302 and the metal base 304. For example, as shown in FIGS. 20A and 20B, the metal base 304 and the bolts 350 are integrated together by integral molding or welding so as not to rotate the bolts. FIG. 20A is a plan view of the power module 300, and FIG. 20B is a cross-sectional view of FIG. 20A taken along a line E-E.

Figure 21A:
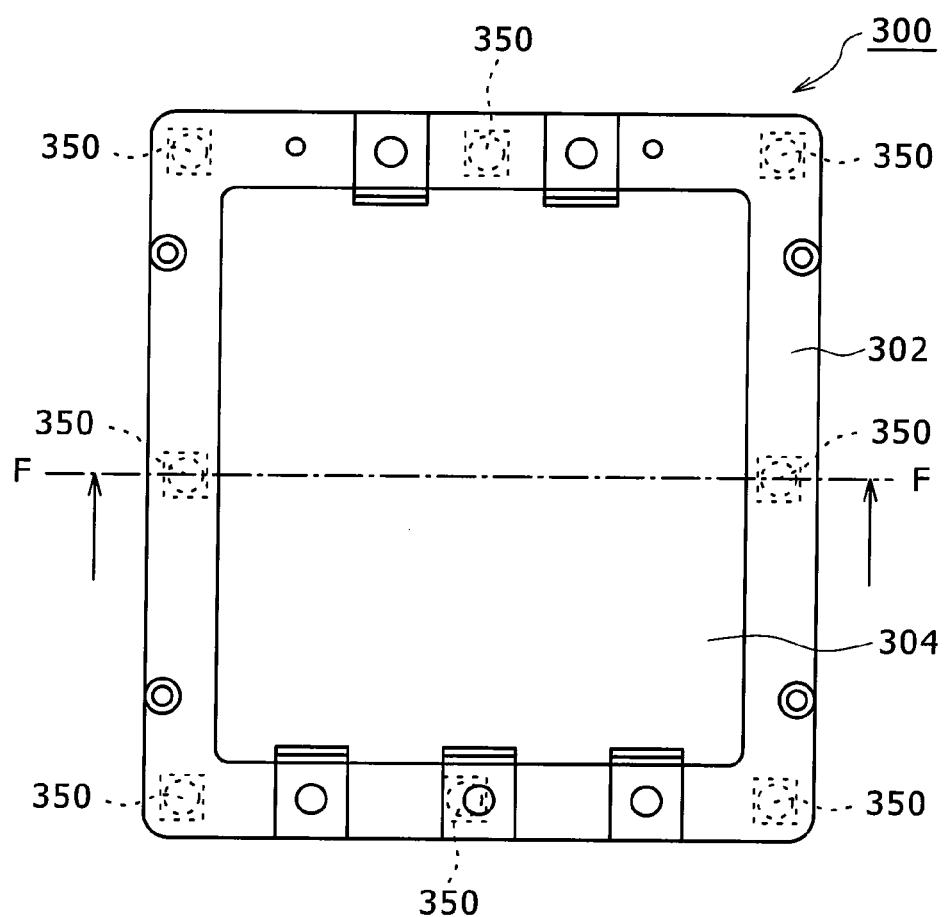
FIGS. 21A and 21B are diagrams for explaining a fastening structure in which fastener bolts are stopped from turning at all of four corners and intermediate points between the respective corners of the metal base, and the power module is fastened by nuts from the rear surface of the cooling jacket, FIG. 21A being a plan view of the power module, and FIG. 21B being a cross-sectional view of FIG. 21A taken along a line F-F.
Figure 21B:
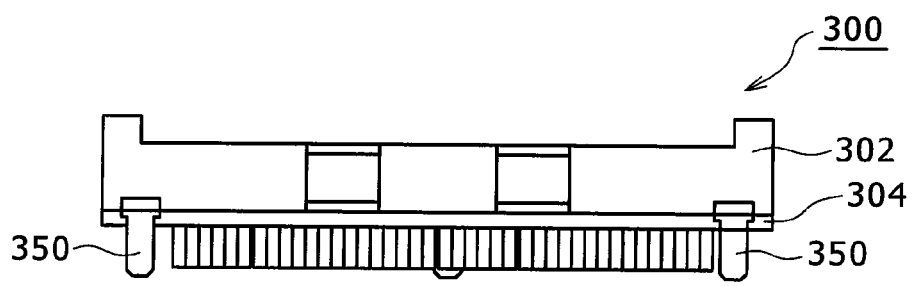
Figure 22A:
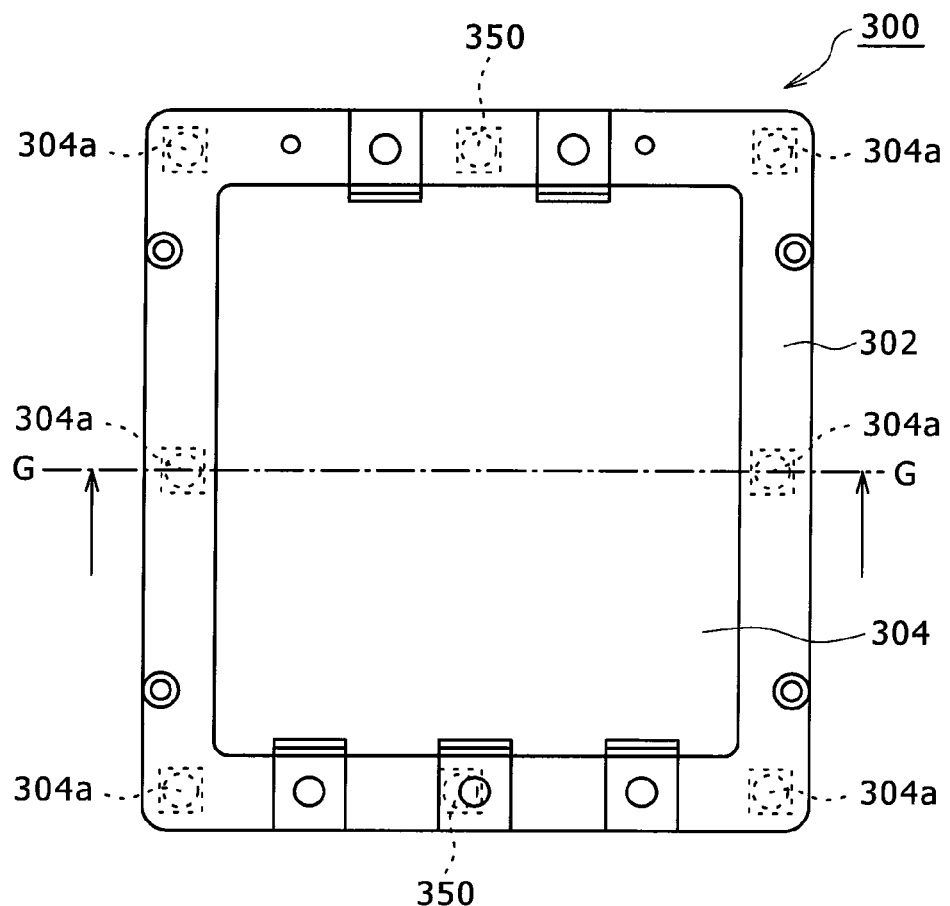
FIGS. 22A and 22B are diagrams for explaining the power module with bolt holes being defined in the metal base, FIG. 22A being a plan view of the power module, and FIG. 22B being a cross-sectional view of FIG. 22A taken along a line G-G.
Figure 22B:
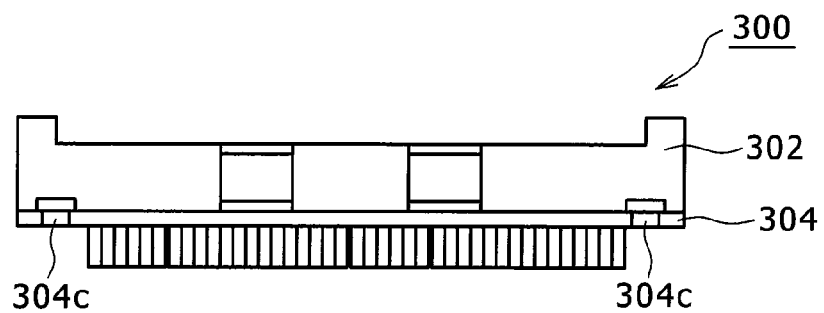

(4) In the above embodiment, fastening is executed on only the peripheral edge intermediate points of the metal base 304 from the rear surface side of the cooling jacket 19A. Alternatively, as shown in FIG. 21, the bolts 350 preventing from turning may be also located at the four corners of the metal base 304 to conduct fastening from the rear surface side of the cooling jacket 19A. FIG. 21A is a plan view of the power module 300, and FIG. 21B is a cross-sectional view of FIG. 21A taken along a line F-F. Only the four corners of the metal base 304 may be fastened from the rear surface side:

(3) As shown in FIG. 22, it is possible that the bolt holes 304*c* are threaded in the metal base 304, and bolts not shown pass through the bolt holes 304*c* from beneath of the cooling jacket 19A so that the former is screwed with the latter, and the power module 300 is fixed to the cooling jacket 19A. In this example, FIG. 22A is a plan view of the power module 300, and FIG. 22B is a cross-sectional view of FIG. 22A taken along a line G-G.

(4) The cooling jacket 19A is integrally disposed at the middle of the housing 12, but the installation position of the cooling jacket 19A is not limited to the embodiment. The cooling jacket 19A may be separated from the housing 12.

(5) The U-turn flow passage sectioned into the go-path and the return-path is defined in the cooling jacket 19A. Alternatively, the coolant flow passage may be one-way flow passage. The cooling water may be another cooling liquid.

(6) The power conversion apparatus according to this embodiment has a pair of power modules 300. Alternatively, the present invention is applicable to a power conversion apparatus having one power module. In this case, the cooling jacket 19A may have one opening.

(7) The radiation portion of the rear surface of the metal base 104 may be tabular with the radiation fins 305 being omitted. Also, the radiator is exposed to the cooling liquid so as to be directly cooled. Alternatively, the present invention is applicable to a system in which the opening of the cooling jacket 19A is omitted, and the radiator is brought in contact with the front surface of the cooling jacket 19A to perform indirect cooling.

(8) The intermediate points of the power module case 302 may be fastened by the front surface side fastening part.

(9) The metal base 104 is fastened in a peripheral edge thereof, alternatively, the center portion of the metal base 104 may be fastened to the cooling jacket 19A.

(10) Instead of the rear surface side fastening device and the front surface side fastening device, the metal base 104 may be fastened to the cooling jacket 19A from the rear surface side and/or the front surface side by caulking.

(11) The input/output terminal may be integrated with the power module case 302 being a case member. For example, the input/output terminal may be embedded in the power module case 302.

(12) Not only the input/output terminal of the strong electric system, but also a control terminal of the weak electric system may be disposed in a case member such as the power module case 302.

(13) The electrode being the input/output terminal erects from the metal base 304 in the vicinity of the power module case 302, and may be so bent as to cover the top surface of the power module case 302.

(14) The configuration member of the power module is not limited to the input/output terminals of the electric power system or the control system, but may be another member necessary to constitute the power module. For example, the power module case 302 per se is a configuration member of the power module.

This embodiment and one modified example, or plural modified examples can be combined. It is possible to combine the modified examples in any manner.

The above description is one example, and the present invention is not limited to the configuration of the above embodiment.

What is claimed is:
1. A power conversion apparatus, comprising:
a housing having a cooling jacket;
a power module having a semiconductor circuit performing power conversion between DC power and AC power, mounted on a surface thereof, and a radiator disposed on a rear surface; and
a fastening device for fixing the power module to the cooling jacket, the fastening device including a front surface side fastening part that fastens the power module to the cooling jacket by fastening operation from the front surface side of the power module, and a rear surface side fastening part that fastens the power module to the cooling jacket by fastening operation from the rear surface side of the power module; wherein,
at least one configuration part of the power module is arranged on a front surface area of the power module facing the rear surface side fastening part;
the power module includes a metal base, the semiconductor circuit is mounted on the front surface of the metal base and the radiator comprises a radiation fin that is projected from the rear surface;

the rear surface side fastening part is arranged to fasten the metal base to the cooling jacket around the semiconductor circuit; and
the configuration parts of the power module are arranged around the semiconductor circuit;
the rear surface side fastening part comprises a plurality of bolts each having a screw portion that projects from the rear surface of the metal base and is prevented from rotation and nuts screwed with the plurality of bolts at the rear surface side of the power module;
the power module further includes a case member disposed to surround the semiconductor circuit at the peripheral edge of the metal base; and
the case member is equipped with an engagement portion that is configured to engage with the head of the bolt.

2. The power conversion apparatus according to claim 1, wherein:
the cooling jacket has a coolant flow passage, and an opening for performing thermal exchange between the radiator and the cooling liquid;
the opening is sealed by the power module; and
the radiator is exposed to the flow passage through the opening.

3. The power conversion apparatus according to claim 1, wherein the power module configuration parts are arranged in the peripheral edge of the power module.

4. The power conversion apparatus according to claim 2, wherein:
the opening is closed by the metal base,
the front surface side fastening part comprises a bolt, or a bolt and a nut which fix the metal base to the cooling jacket by fastening operation from a front surface side of the power module; and
the rear surface side fastening part comprises a bolt, or a bolt and nut which fix the metal base to the cooling jacket by fastening operation from the rear surface side.

5. The power conversion apparatus according to claim 1, wherein the metal base has an engagement portion that is configured to engage with the head of the bolts to prevent the rotation of the bolts.

6. The power conversion apparatus according to claim 1, wherein the at least one configuration part of the power module includes said case member.

7. The power conversion apparatus according to claim 6, wherein a top surface of the case member is equipped with an input/output terminal electrode.

8. The power conversion apparatus according to claim 7, wherein the input/output terminal is an AC power and DC power terminal.

9. The power conversion apparatus according to claim 1, wherein:
the cooling jacket is disposed in the middle of the housing;
a substrate having a circuit for controlling the semiconductor circuit mounted thereon is disposed in a space above the housing with the cooling jacket sandwiched therebetween; and
a smoothing capacitor for smoothing a DC component supplied to the semiconductor circuit is located in a lower space of the housing, with the cooling jacket sandwiched therebetween.

10. A power module, comprising:
a semiconductor circuit having an inverter circuit for performing power conversion between DC power and AC power;
a metal base having a switching element for the inverter circuit mounted on a front surface, and a radiator disposed on a rear surface;

a case member disposed to surround the semiconductor circuit at the peripheral edge of the metal base;

at least one input/output terminal disposed on a top surface of the case member; and a rear surface side fastening part disposed on the rear surface of the metal base for fastening the metal base to the housing from the rear surface side; wherein, the rear surface side fastening part comprises a plurality of bolts each having a screw portion that projects from the rear surface of the metal base and is prevented from rotation, and nuts screwed with the plurality of bolts at the rear surface side of the power module;

the power module further includes a case member disposed to surround the semiconductor circuit at the peripheral edge of the metal base; and the case member is equipped with an engagement portion that is configured to engage with the head of the bolt.

* * * * *